US009606676B2

(12) United States Patent
Shepelev

(10) Patent No.: US 9,606,676 B2
(45) Date of Patent: Mar. 28, 2017

(54) INPUT DEVICE

(71) Applicant: Synaptics Incorporated, Santa Clara, CA (US)

(72) Inventor: Petr Shepelev, San Jose, CA (US)

(73) Assignee: Synaptics Incorporated, San Jose, CA (US)

( * ) Notice: Subject to any disclaimer, the term of this patent is extended or adjusted under 35 U.S.C. 154(b) by 0 days.

(21) Appl. No.: 13/753,369

(22) Filed: Jan. 29, 2013

(65) Prior Publication Data

US 2014/0210764 A1 Jul. 31, 2014

(51) Int. Cl.
G06F 3/044 (2006.01)

(52) U.S. Cl.
CPC ..................... *G06F 3/044* (2013.01)

(58) Field of Classification Search
CPC ....................................... G06F 3/044
See application file for complete search history.

(56) References Cited

U.S. PATENT DOCUMENTS

| 5,495,077 | A | 2/1996 | Miller et al. |
| 5,534,892 | A | 7/1996 | Tagawa |
| 5,790,106 | A | 8/1998 | Hirano et al. |
| 5,841,078 | A | 11/1998 | Miller et al. |
| 6,377,228 | B1 | 4/2002 | Jenkin et al. |
| 6,525,546 | B1 | 2/2003 | Zhao et al. |
| 7,262,609 | B2 * | 8/2007 | Reynolds ............... 324/678 |
| 7,446,694 | B1 | 11/2008 | Ahmed et al. |
| 7,548,073 | B2 * | 6/2009 | Mackey et al. ............. 324/660 |
| 7,583,092 | B2 | 9/2009 | Reynolds et al. |
| 7,653,883 | B2 | 1/2010 | Hotelling et al. |
| 7,733,557 | B2 * | 6/2010 | Handschy et al. ............ 359/279 |
| 7,777,501 | B2 | 8/2010 | Reynolds et al. |
| 7,848,825 | B2 | 12/2010 | Wilson et al. |
| 7,880,481 | B2 | 2/2011 | Zangl et al. |

(Continued)

FOREIGN PATENT DOCUMENTS

| CN | 101393502 A | 3/2009 |
| CN | 101553711 A | 10/2009 |

(Continued)

OTHER PUBLICATIONS

US 8,406,363, 3/2013, Kato et al. (withdrawn).

(Continued)

*Primary Examiner* — Kumar Patel
*Assistant Examiner* — Sejoon Ahn
(74) *Attorney, Agent, or Firm* — Osha Liang LLP

(57) ABSTRACT

An input device comprises a first and second pluralities of capacitive sensor electrodes. The first plurality of capacitive sensor electrodes is oriented along a first axis, disposed in a first layer, and configured to update a display screen of the input device. The second plurality of capacitive sensor electrodes is oriented along a second axis that differs from the first axis. A display region of the display screen has a first dimension along the first axis and a second dimension the second axis. At least one sensor electrode of the first plurality of capacitive sensor electrodes extends fully across the first dimension of the display region. Individual sensor electrodes of the second plurality of capacitive sensor electrodes do not extend fully across the second dimension of the display region.

21 Claims, 11 Drawing Sheets

(56) References Cited

U.S. PATENT DOCUMENTS

| | | | |
|---|---|---|---|
| 7,924,029 B2 | 4/2011 | Reynolds et al. | |
| 7,966,884 B2 | 6/2011 | Shikata | |
| 8,159,471 B2 | 4/2012 | Utsunomiya et al. | |
| 8,237,453 B2 | 8/2012 | Badaye et al. | |
| 8,259,078 B2 * | 9/2012 | Hotelling et al. | 345/173 |
| 8,279,194 B2 * | 10/2012 | Kent et al. | 345/174 |
| 8,300,029 B2 * | 10/2012 | Lee et al. | 345/174 |
| 8,362,988 B2 | 1/2013 | Hsieh et al. | |
| 8,415,959 B2 | 4/2013 | Badaye | |
| 8,437,439 B2 | 5/2013 | Kato et al. | |
| 8,458,788 B2 | 6/2013 | Gillespie et al. | |
| 8,482,545 B2 | 7/2013 | King-Smith et al. | |
| 8,564,552 B2 | 10/2013 | Yilmaz | |
| 8,624,856 B2 | 1/2014 | Kim et al. | |
| 8,638,107 B2 | 1/2014 | Schwartz et al. | |
| 8,669,640 B2 * | 3/2014 | Lin et al. | 257/586 |
| 8,686,735 B2 | 4/2014 | Weinerth et al. | |
| 8,884,921 B2 * | 11/2014 | Kim et al. | 345/174 |
| 9,354,264 B2 | 5/2016 | Schwartz et al. | |
| 2006/0038791 A1 * | 2/2006 | Mackey | 345/173 |
| 2006/0227115 A1 | 10/2006 | Fry | |
| 2006/0244734 A1 | 11/2006 | Hill et al. | |
| 2007/0159184 A1 * | 7/2007 | Reynolds et al. | 324/662 |
| 2007/0236477 A1 | 10/2007 | Ryu et al. | |
| 2008/0061800 A1 * | 3/2008 | Reynolds et al. | 324/678 |
| 2008/0111795 A1 | 5/2008 | Bollinger | |
| 2008/0116904 A1 * | 5/2008 | Reynolds et al. | 324/678 |
| 2008/0136985 A1 | 6/2008 | Hsieh et al. | |
| 2008/0158177 A1 | 7/2008 | Wilson et al. | |
| 2008/0173094 A1 | 7/2008 | Shikata et al. | |
| 2008/0252608 A1 * | 10/2008 | Geaghan | G06F 3/044 345/173 |
| 2008/0259044 A1 * | 10/2008 | Utsunomiya et al. | 345/173 |
| 2008/0309622 A1 | 12/2008 | Krah | |
| 2009/0033343 A1 * | 2/2009 | Reynolds et al. | 324/688 |
| 2009/0110111 A1 | 4/2009 | Kato et al. | |
| 2009/0160461 A1 | 6/2009 | Zangl et al. | |
| 2009/0267903 A1 | 10/2009 | Cady et al. | |
| 2009/0325643 A1 | 12/2009 | Hamadene et al. | |
| 2010/0085325 A1 | 4/2010 | King-Smith et al. | |
| 2010/0156795 A1 | 6/2010 | Kim et al. | |
| 2010/0159995 A1 | 6/2010 | Stallings et al. | |
| 2010/0214232 A1 | 8/2010 | Chan et al. | |
| 2010/0253651 A1 * | 10/2010 | Day | 345/175 |
| 2010/0258360 A1 * | 10/2010 | Yilmaz | 178/18.06 |
| 2010/0283760 A1 | 11/2010 | Leung et al. | |
| 2010/0292945 A1 * | 11/2010 | Reynolds et al. | 702/65 |
| 2010/0328255 A1 * | 12/2010 | Ishizaki et al. | 345/174 |
| 2011/0018557 A1 * | 1/2011 | Badaye | 324/658 |
| 2011/0025636 A1 * | 2/2011 | Ryu | G06F 3/0416 345/173 |
| 2011/0025639 A1 * | 2/2011 | Trend et al. | 345/174 |
| 2011/0062971 A1 * | 3/2011 | Badaye | 324/686 |
| 2011/0095996 A1 * | 4/2011 | Yilmaz | 345/173 |
| 2011/0095997 A1 * | 4/2011 | Philipp | 345/173 |
| 2011/0134055 A1 | 6/2011 | Jung et al. | |
| 2011/0141040 A1 | 6/2011 | Kang et al. | |
| 2011/0141042 A1 * | 6/2011 | Kim et al. | 345/173 |
| 2011/0141051 A1 * | 6/2011 | Ryu | 345/173 |
| 2011/0148435 A1 * | 6/2011 | Schwartz et al. | 324/658 |
| 2011/0148436 A1 * | 6/2011 | Dattalo | 324/663 |
| 2011/0210940 A1 * | 9/2011 | Reynolds | 345/174 |
| 2011/0277030 A1 * | 11/2011 | Gillespie et al. | 726/17 |
| 2012/0032895 A1 * | 2/2012 | Westerman et al. | 345/173 |
| 2012/0050180 A1 | 3/2012 | King et al. | |
| 2012/0050216 A1 * | 3/2012 | Kremin et al. | 345/174 |
| 2012/0062506 A1 * | 3/2012 | Chae et al. | 345/174 |
| 2012/0098791 A1 * | 4/2012 | Hamada et al. | 345/174 |
| 2012/0120006 A1 | 5/2012 | Liu | |
| 2012/0120011 A1 * | 5/2012 | Teng et al. | 345/173 |
| 2012/0207244 A1 * | 8/2012 | Weinerth et al. | 375/316 |
| 2012/0235691 A1 * | 9/2012 | Ho et al. | 324/658 |
| 2012/0268418 A1 * | 10/2012 | Ishizaki et al. | 345/174 |
| 2012/0306802 A1 | 12/2012 | McCracken et al. | |
| 2013/0016065 A1 * | 1/2013 | Reynolds et al. | 345/174 |
| 2013/0043942 A1 * | 2/2013 | Konoshita et al. | 330/69 |
| 2013/0088175 A1 * | 4/2013 | Nishikawa et al. | 315/362 |
| 2013/0113735 A1 * | 5/2013 | Takeuchi et al. | 345/173 |
| 2013/0169340 A1 * | 7/2013 | Tao et al. | 327/336 |
| 2013/0241868 A1 * | 9/2013 | Kim et al. | 345/174 |
| 2013/0285966 A1 * | 10/2013 | Kimura et al. | 345/173 |
| 2013/0335366 A1 * | 12/2013 | Lee et al. | 345/174 |
| 2013/0335367 A1 * | 12/2013 | Kim | 345/174 |
| 2014/0009438 A1 * | 1/2014 | Liu | G06F 1/16 345/174 |
| 2014/0022188 A1 * | 1/2014 | Ahn | 345/173 |
| 2014/0043284 A1 * | 2/2014 | Park et al. | 345/174 |
| 2014/0049500 A1 * | 2/2014 | Chen et al. | 345/174 |
| 2014/0103941 A1 * | 4/2014 | Chou | G06F 3/044 324/658 |
| 2014/0152324 A1 | 6/2014 | Schwartz et al. | |
| 2014/0152621 A1 * | 6/2014 | Okayama et al. | 345/174 |
| 2014/0167619 A1 * | 6/2014 | Land et al. | 315/152 |
| 2014/0184534 A1 * | 7/2014 | Lee et al. | 345/173 |
| 2014/0184552 A1 * | 7/2014 | Tanemura | G06F 3/044 345/174 |
| 2014/0198087 A1 * | 7/2014 | Knausz et al. | 345/212 |
| 2015/0324036 A1 | 11/2015 | Schwartz et al. | |

FOREIGN PATENT DOCUMENTS

| | | |
|---|---|---|
| JP | 2009009249 A | 1/2009 |
| JP | 2009163739 A | 7/2009 |
| JP | 2010108505 A2 | 5/2010 |
| KR | 10-2008-0081411 | 9/2008 |

OTHER PUBLICATIONS

Office Action, U.S. Appl. No. 12/970,898, mailed May 23, 2013, 19 pages.

Office Action, JP Application No. 2012-544857, 5 pages, Nov. 25, 2014.

Office Action, U.S. Appl. No. 14/085,606, mailed Nov. 6, 2015, 29 pages.

Korean Patent Application No. 2012-7015652 Office Action mailed Aug. 23, 2016, translation 2 pgs.

Office Action Search Report, CN Application No. 201080059384.4, 2 pages, Sep. 22, 2014 (Sep. 22, 2014).

Office Action, JP Application No. P2012-544857, 2 pages, Mar. 11, 2014 (Mar. 11, 2014).

* cited by examiner

1000

DETERMINE FIRST POSITIONAL INFORMATION RELATED TO INPUT IN A FIRST SENSING REGION OF AN INPUT DEVICE BY PERFORMING TRANSCAPACITIVE SENSING USING A FIRST PLURALITY OF CAPACITIVE SENSOR ELECTRODES AND A SECOND PLURALITY OF CAPACITIVE SENSOR ELECTRODES, WHEREIN THE FIRST PLURALITY OF CAPACITIVE SENSOR ELECTRODES IS ORIENTED ALONG A FIRST AXIS AND DISPOSED IN A FIRST LAYER, AND WHEREIN THE SECOND PLURALITY OF CAPACITIVE SENSOR ELECTRODES IS ORIENTED ALONG A SECOND AXIS THAT DIFFERS FROM THE FIRST AXIS AND IS DISPOSED IN A SECOND LAYER THAT DIFFERS FROM THE FIRST LAYER

1010

DETERMINE POSITIONAL INFORMATION ALONG THE SECOND AXIS, WITH RESPECT TO INPUT IN A SECOND SENSING REGION OF THE INPUT DEVICE, THE POSITIONAL INFORMATION ALONG THE SECOND AXIS DETERMINED BY PERFORMING ABSOLUTE CAPACITIVE SENSING USING EITHER A FIRST SUBSET OR A SECOND SUBSET OF THE SECOND PLURALITY OF CAPACITIVE SENSING ELECTRODES

INPUT DEVICE

CROSS-REFERENCE TO RELATED UNITED STATES PATENT APPLICATION

This application is related to U.S. patent application Ser. No. 12/970,898 filed on Dec. 16, 2012, entitled "TRANSCAPACITIVE SENSOR DEVICES WITH OHMIC SEAMS" by Kirk Hargreaves et al., and assigned to the assignee of the present application.

BACKGROUND

Input devices including proximity sensor devices (also commonly called touchpads or touch sensor devices) are widely used in a variety of electronic systems. A proximity sensor device typically includes a sensing region, often demarked by a surface, in which the proximity sensor device determines the presence, location and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers). Proximity sensor devices are also often used in smaller computing systems (such as touch screens integrated in cellular phones and tablet computers). Such touch screen input devices are typically superimposed upon or otherwise collocated with a display of the electronic system.

SUMMARY

An input device comprises a first and second pluralities of capacitive sensor electrodes. The first plurality of capacitive sensor electrodes is oriented along a first axis, disposed in a first layer, and configured to update a display of the input device. The second plurality of capacitive sensor electrodes is oriented along a second axis that differs from the first axis. A display region of the display has a first dimension along the first axis and a second dimension the second axis. At least one sensor electrode of the first plurality of capacitive sensor electrodes extends fully across the first dimension of the display region. Individual sensor electrodes of the second plurality of capacitive sensor electrodes do not extend fully across the second dimension of the display region.

BRIEF DESCRIPTION OF DRAWINGS

The drawings referred to in this Brief Description of Drawings should not be understood as being drawn to scale unless specifically noted. The accompanying drawings, which are incorporated in and form a part of the Description of Embodiments, illustrate various embodiments and, together with the Description of Embodiments, serve to explain principles discussed below, where like designations denote like elements.

FIGS. 10A and 10B illustrate a method of operating an input device, according to various embodiments.

DESCRIPTION OF EMBODIMENTS

The following Description of Embodiments is merely provided by way of example and not of limitation. Furthermore, there is no intention to be bound by any expressed or implied theory presented in the preceding Background, Summary, or Brief Description of Drawings or the following Description of Embodiments.

Overview of Discussion

Herein, various embodiments are described that provide input devices, processing systems, and methods that facilitate improved usability. In various embodiments described herein, the input device may be a capacitive input device. Embodiments associated with an input device, which may be a touch screen that responds to capacitive inputs, are described herein.

Discussion begins with a description of an example input device with which, or upon which, various embodiments described herein may be implemented. An example stackup which illustrates layers of a touch screen of the input device is presented and described. Several example sensor electrode patterns are then described. This is followed by description of an example processing system and some components thereof. The processing system may be utilized with an input device, such as a capacitive sensing device. Operation of the input device, processing system, and components thereof are then further described in conjunction with description of an example method of operating an input device.

Example Input Device

Figure 1:
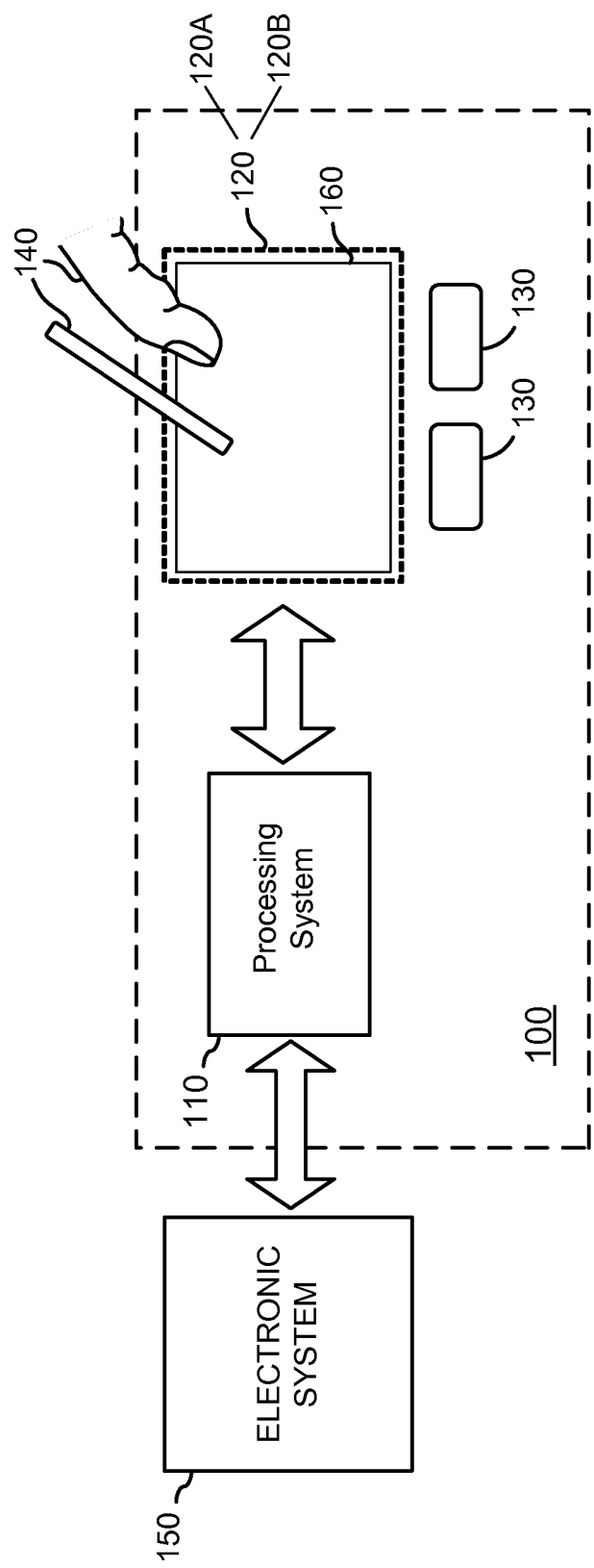
FIG. 1 is top plan view of a block diagram of an example input device, in accordance with embodiments.

Turning now to the figures, FIG. 1 is a block diagram of an exemplary input device 100, in accordance with various embodiments. Input device 100 may be configured to provide input to an electronic system/device 150. As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device 100 and separate joysticks or key switches. Further example electronic systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic systems could be a host or a slave to the input device.

Input device 100 can be implemented as a physical part of the electronic systems 150, or can be physically separate from the electronic system 150. As appropriate, input device 100 may communicate with parts of the electronic system using any one or more of the following: buses, networks, and other wired or wireless interconnections. Examples include, but are not limited to: Inter-Integrated Circuit (I2C), Serial Peripheral Interface (SPI), Personal System 2 (PS/2), Universal Serial Bus (USB), Bluetooth®, Radio Frequency (RF), and Infrared Data Association (IrDA).

In FIG. 1, input device 100 is shown as a proximity sensor device (also often referred to as a "touchpad" or a "touch sensor device") configured to sense input provided by one or more input objects 140 in a sensing region 120. As will be described further in conjunction with FIG. 2, sensing region has two different portions 120A, and 120B which substantially overlap in this view, but project in different fashions from one another. Example input objects include fingers and styli, as shown in FIG. 1.

Sensing region 120 encompasses any space above, around, in and/or near input device 100, in which input device 100 is able to detect user input (e.g., user input provided by one or more input objects 140). The sizes, shapes, and locations of particular sensing regions may vary widely from embodiment to embodiment. In some embodiments, sensing region 120 extends from a surface of input device 100 in one or more directions into space until signal-to-noise ratios prevent sufficiently accurate object detection. The distance to which this sensing region 120 extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of input device 100, contact with an input surface (e.g., a touch surface) of input device 100, contact with an input surface of input device 100 coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, sensing region 120 has a rectangular shape when projected onto an input surface of input device 100.

Input device 100 may utilize any combination of sensor components and sensing technologies to detect user input in sensing region 120. Input device 100 comprises one or more sensing elements for detecting user input. As a non-limiting example, input device 100 may use capacitive techniques.

Some implementations are configured to provide images that span one, two, three, or higher dimensional spaces. Some implementations are configured to provide projections of input along particular axes or planes.

In some capacitive implementations of input device 100, voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensing elements to create electric fields. In some capacitive implementations, separate sensing elements may be ohmically shorted together to form larger sensor electrodes. Some capacitive implementations utilize resistive sheets, which may be uniformly resistive.

Some capacitive implementations utilize "self capacitance" (or "absolute capacitance") sensing methods based on changes in the capacitive coupling between sensor electrodes and an input object. In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage (e.g., system ground), and by detecting the capacitive coupling between the sensor electrodes and input objects.

Some capacitive implementations utilize "mutual capacitance" (or "transcapacitance") sensing methods based on changes in the capacitive coupling between sensor electrodes. In various embodiments, an input object near the sensor electrodes alters the electric field between the sensor electrodes, thus changing the measured capacitive coupling. In one implementation, a transcapacitive sensing method operates by detecting the capacitive coupling between one or more transmitter sensor electrodes (also "transmitter electrodes" or "transmitters") and one or more receiver sensor electrodes (also "receiver electrodes" or "receivers"). Collectively transmitters and receivers may be referred to as sensor electrodes or sensor elements. Transmitter sensor electrodes may be modulated relative to a reference voltage (e.g., system ground) to transmit transmitter signals. Receiver sensor electrodes may be held substantially constant relative to the reference voltage to facilitate receipt of resulting signals. A resulting signal may comprise effect(s) corresponding to one or more transmitter signals, and/or to one or more sources of environmental interference (e.g., other electromagnetic signals). Sensor electrodes may be dedicated transmitters or receivers, or may be configured to both transmit and receive. In some embodiments, one or more receiver electrodes may be operated to receive a resulting signal when no transmitter electrodes are transmitting (e.g., the transmitters are disabled). In this manner, the resulting signal represents noise detected in the operating environment of sensing region 120.

In FIG. 1, a processing system 110 is shown as part of input device 100. Processing system 110 is configured to operate the hardware of input device 100 to detect input in sensing region 120. Processing system 110 comprises parts of or all of one or more integrated circuits (ICs) and/or other circuitry components. (For example, a processing system for a mutual capacitance sensor device may comprise transmitter circuitry configured to transmit signals with transmitter sensor electrodes, and/or receiver circuitry configured to receive signals with receiver sensor electrodes). In some embodiments, processing system 110 also comprises electronically-readable instructions, such as firmware code, software code, and/or the like. In some embodiments, components composing processing system 110 are located together, such as near sensing element(s) of input device 100. In other embodiments, components of processing system 110 are physically separate with one or more components close to sensing element(s) of input device 100, and one or more components elsewhere. For example, input device 100 may be a peripheral coupled to a desktop computer, and processing system 110 may comprise software configured to run on a central processing unit of the desktop computer and one or more ICs (perhaps with associated firmware) separate from the central processing unit. As another example, input device 100 may be physically integrated in a phone, and processing system 110 may comprise circuits and firmware that are part of a main processor of the phone. In some embodiments, processing system 110 is dedicated to implementing input device 100. In other embodiments, processing system 110 also performs other functions, such as operating display screen (e.g., display screen 160), driving haptic actuators, etc.

Processing system 110 may be implemented as a set of modules that handle different functions of processing system 110. Each module may comprise circuitry that is a part of processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) to detect input, identification modules configured to identify gestures such as mode changing gestures, and mode changing modules for changing operation modes.

In some embodiments, processing system 110 responds to user input (or lack of user input) in sensing region 120 directly by causing one or more actions. Example actions include changing operation modes, as well as GUI actions such as cursor movement, selection, menu navigation, and other functions. In some embodiments, processing system 110 provides information about the input (or lack of input) to some part of the electronic system (e.g., to a central processing system of the electronic system that is separate from processing system 110, if such a separate central processing system exists). In some embodiments, some part of the electronic system processes information received from processing system 110 to act on user input, such as to facilitate a full range of actions, including mode changing actions and GUI actions.

For example, in some embodiments, processing system 110 operates the sensing element(s) of input device 100 to produce electrical signals indicative of input (or lack of input) in sensing region 120. Processing system 110 may perform any appropriate amount of processing on the electrical signals in producing the information provided to the electronic system. For example, processing system 110 may digitize analog electrical signals obtained from the sensor electrodes. As another example, processing system 110 may perform filtering or other signal conditioning. As yet another example, processing system 110 may subtract or otherwise account for a baseline, such that the information reflects a difference between the electrical signals and the baseline. As yet further examples, processing system 110 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, input device 100 is implemented with additional input components that are operated by processing system 110 or by some other processing system. These additional input components may provide redundant functionality for input in sensing region 120, or some other functionality. FIG. 1 shows buttons 130 near sensing region 120 that can be used to facilitate selection of items using input device 100. Other types of additional input components include sliders, balls, wheels, switches, and the like. Conversely, in some embodiments, input device 100 may be implemented with no other input components.

In some embodiments, input device 100 may be a touch screen, and sensing region 120 overlaps at least part of an active display region of display screen 160. For example, input device 100 may comprise substantially transparent sensor electrodes overlaying the display screen 160 and provide a touch screen interface for the associated electronic system 150. Display screen 160 may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. Input device 100 and the display screen 160 may share physical elements. For example, some embodiments may utilize some of the same electrical components for displaying and sensing. As another example, display screen 160 may be operated in part or in total by processing system 110.

It should be understood that while many embodiments are described in the context of a fully functioning apparatus, the mechanisms are capable of being distributed as a program product (e.g., software) in a variety of forms. For example, the mechanisms that are described may be implemented and distributed as a software program on information bearing media that are readable by electronic processors (e.g., non-transitory computer-readable and/or recordable/writable information bearing media readable by processing system 110). Additionally, the embodiments apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other tangible storage technology.

Example Touch Screen Stackup

Figure 2:
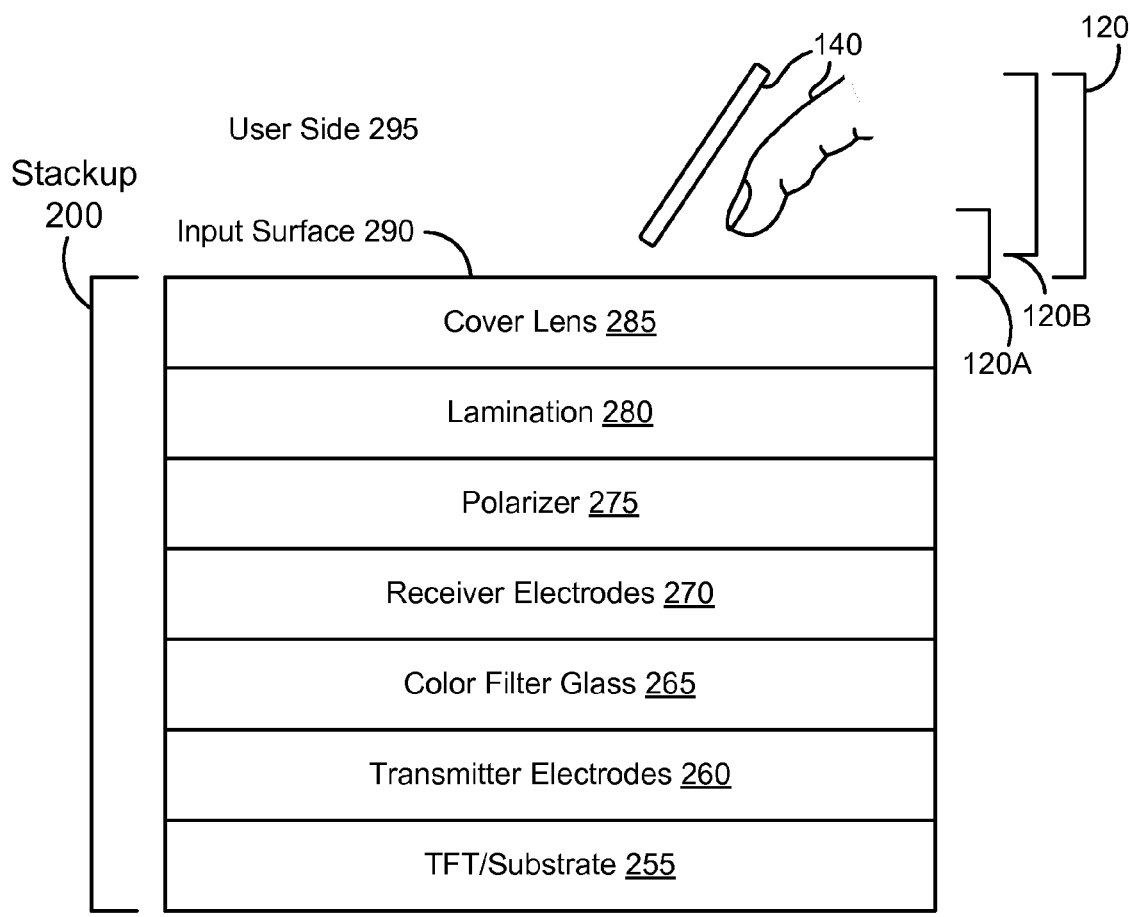
FIG. 2 shows a side view of an example stackup of the layers of a combined touch screen and display screen which may be utilized to both display information and to generate all or part of the sensing region of an input device, according to some embodiments.

FIG. 2 shows a side view of an example stackup 200 of the layers of a combined touch screen and display screen which may be utilized to both display information and to generate all or part of the sensing region 120 of an input device 100, according to some embodiments. This combination of touch and display screens may be referred to as a "touch display." As can be seen, stackup 200 includes an input surface 290 on a user side 295 of stackup 200. Stackup 200 shows an example ordering of the layers used to build a touch screen in some embodiments. In order, from furthest from a user input side to closest to a user input side of input device 100, stackup 200 includes: thin-film transistor/substrate 255, transmitter electrodes 260, color filter (CF) Glass 265, receiver electrodes 270, polarizer 275, lamination 280, and cover lens 285. Additionally, liquid crystal material may be disposed between layers such as CF glass 265 and thin-film transistor 255. Although some variations in ordering are possible, embodiments described herein will often include transmitter electrodes which are closer in the stackup 200, than receiver electrodes 270 are, to thin-film transistor substrate 255. Likewise, receiver electrodes 270 will often be closer, than transmitter electrodes 360 are, to the user side 295 of stackup 200. Some examples of variations can include omission of some layers such as cover lens 285 and/or lamination 280; variations in the location of receiver electrodes 270; and disposition of transmitter electrodes 260 and receiver electrodes 270 into a single common layer. For example, in some embodiments, either or both of transmitter electrodes 260 and receiver electrodes 270 may be disposed on an underside of color filter glass 265, which is proximal to thin-film transistors 255.

User input from an input object 140 may be received on or above input surface 290 within sensing region 120 which extends/projects from input surface 290 for some distance above input surface 290. In FIG. 2, a side view of sensing region 120 is presented which illustrates example projections associated with of portions 120A and 120B. In some embodiments, input device 100, utilizes transcapacitive sensing to detect inputs in a first portion 120A of sensing region 120 which extends from the input surface 290 to some distance above the input surface. Typically these inputs in first portion 120A are contact or near-contact inputs. In some embodiments, input device 100 utilizes absolute capacitive sensing to detect inputs in a second portion 120B of sensing region 120, which extends from, or slightly above, input surface 290 to some distance that is a greater extension from input surface 290 than that of first portion 120A. Typically these inputs in second portion 120B are hovering, non-contact inputs, though in some embodiments contact inputs may also be sensed. It is appreciated that in some embodiments, transmitter electrodes 260 may include transmitter electrodes that are used for both refreshing the liquid crystal display and for transmitting transmitter signals that are used for transcapacitive sensing. In some embodiments, transmitter electrodes 260 may be disposed in the thin-film transistor layer 255.

Example Sensor Electrode Patterns

In the illustrated embodiments of FIGS. 3-8, for purposes of clarity, only transmitter electrodes and receiver electrodes are depicted and other layers of a stackup, such as stackup 200, have not been depicted. It is also appreciated that in a crossing sensor electrode pattern, such as the illustrated example, some form of insulating material or substrate is typically disposed between transmitter electrodes and receiver electrodes. Such insulating material is depicted in stackup 200, but has been eliminated in FIGS. 3-8 for purposes of clarity of illustration. However, in some embodiments, transmitter electrodes and receiver electrodes may be disposed on the same layer as one another through use of routing techniques and/or jumpers.

Figure 3:
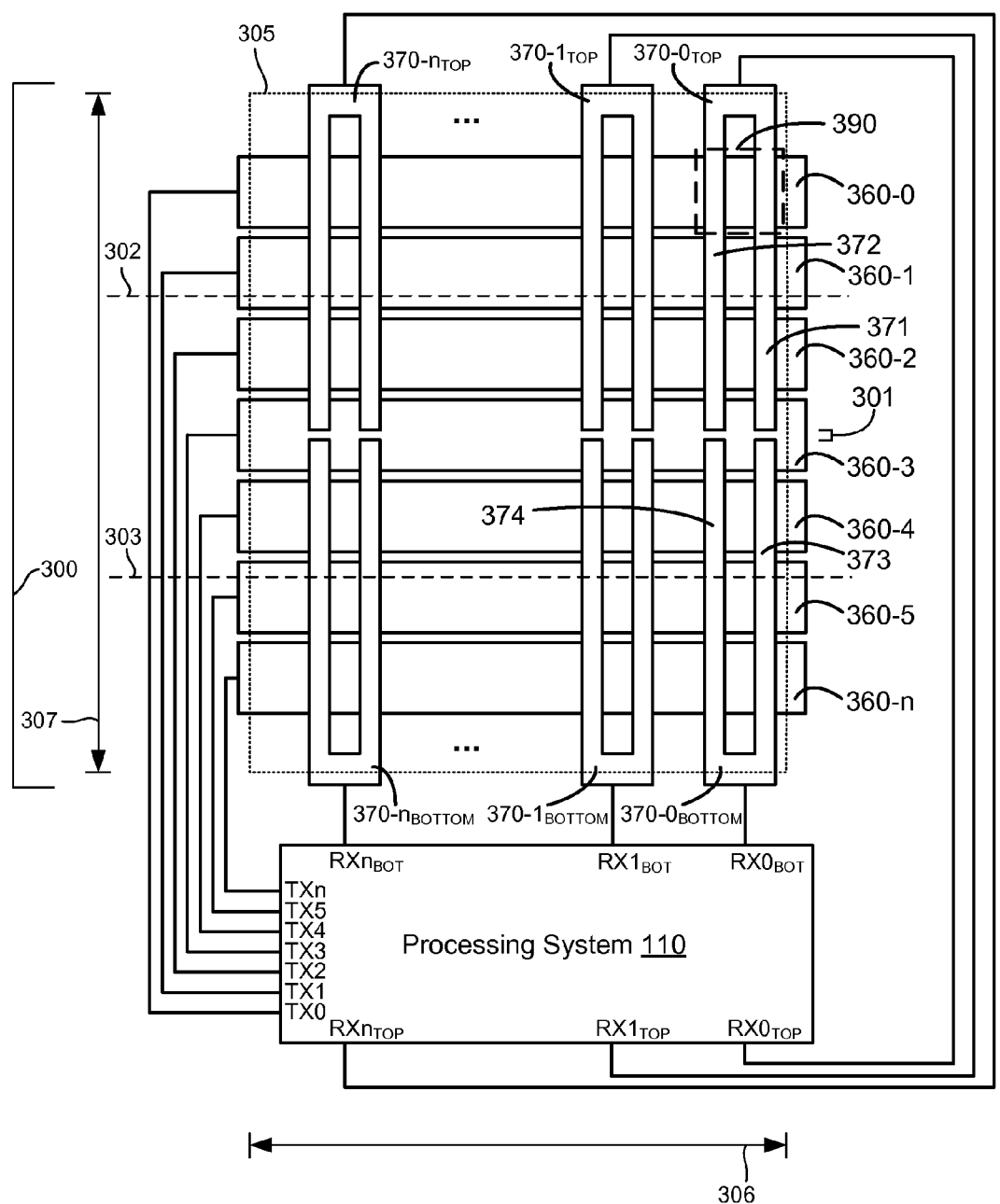
FIG. 3 shows a top plan view of a portion of an example sensor electrode pattern which may be utilized to generate all or part of the sensing region of an input device, according to some embodiments.

FIG. 3 shows a portion of an example sensor electrode pattern 300 which may be utilized to generate all or part of the sensing region of an input device 100, according to various embodiments. Input device 100 is configured as a capacitive input device when utilized with a capacitive sensor electrode pattern, such as sensor electrode pattern 300.

The illustrated sensor electrode pattern 300 is made up of a plurality of transmitter electrodes 360 (360-0, 360-1, 360-2, 360-3, 360-4, 360-5 . . . 360-n) and a plurality of receiver electrodes 370 (370-$0_{TOP}$, 370-$1_{TOP}$, . . . 370-$n_{TOP}$, and 370-$0_{BOTTOM}$, 370-$1_{BOTTOM}$, . . . 370-$n_{BOTTOM}$) which overlay one another, in this example. Transmitter electrodes 360 may be used in stackup 200 in place of transmitter electrodes 260; likewise, receiver electrodes 370 may be used in stackup 200 in place of receiver electrodes 270.

Transmitter electrodes 360-0, 360-1, 360-2, 360-3, 360-4, 360-5 . . . 360-n are respectively coupled with input/outputs TX0, TX1, TX2, TX3, TX4, TX5, and TXn of processing system 110. Transmitter electrodes 360 are oriented along a first axis that is parallel with dimension 306 of display region 305. Transmitter electrodes 360 are a first plurality of sensor electrodes disposed in a first layer, such as layer of transmitter electrodes 260 in stackup 200. In some embodiments, transmitter electrodes 360 are used to both update a display (e.g., a liquid crystal display) of input device 100 and to transmitter signals that are used for transcapacitive sensing. In some embodiments the display update signals and some transmitter signals used for transcapacitive sensing may be one in the same.

In a conventional display only embodiment, color filter glass layer 365 contains a single "common" transparent electrode, typically on, adjacent to liquid crystal material. This common electrode spans the entire display area and is driven with a voltage, typically referred to as "Vcom", and the common electrode is sometimes referred to as the Vcom electrode. Each individual pixel electrode voltage on TFT substrate 255, in combination with the Vcom voltage on the Vcom electrode, creates an electric field across a local region of liquid crystal material, thus controlling the transparency of a single display pixel. Herein, in some embodiments, rather than use a single VCOM electrode, a segmented VCOM electrode is formed by transmitter electrodes, such as transmitter electrodes 360, which may be utilized in a similar manner to perform as a VCOM for display update purposes.

Receiver electrodes 370 are divided into two subsets, a first subset of top receiver electrodes which include receiver electrodes (370-$0_{TOP}$, 370-$1_{TOP}$, . . . 370-$n_{TOP}$), and a second subset of bottom receiver electrodes which include receiver electrodes 370-$0_{BOTTOM}$, 370-$1_{BOTTOM}$, . . . 370-$n_{BOTTOM}$. As depicted in FIG. 3, receiver electrodes 370-$0_{TOP}$, 370-$1_{TOP}$, . . . 370-$n_{TOP}$ are respectively coupled with input/outputs RX0$_{TOP}$, RX1$_{TOP}$, . . . RXn$_{TOP}$ of processing system 110, while receiver electrodes 370-$0_{BOTTOM}$, 370-$1_{BOTTOM}$, . . . 370-$n_{BOTTOM}$ are respectively coupled with input outputs of RX0$_{BOTTOM}$, RX1$_{BOTTOM}$, . . . RXn$_{BOTTOM}$ of processing system 110. In other embodiments, direct electrical connections or logic may be utilized so that a single I/O of processing system 110 may couple to a like numbered top/bottom pair of receiver electrodes 370 (e.g., pair 370-$0_{TOP}$ and 370-$0_{BOTTOM}$); one example of such logic is illustrated and discussed in conjunction with FIG. 8.

Receiver electrodes 370 are oriented along a second axis that is different that the axis with which transmitter electrodes 360 are aligned. For example, in some embodiments, receiver electrodes 370 are parallel to dimension 307 of display region 305. As depicted, dimensions 306 and 307 of display region 305 are orthogonal with respect to one another. In some embodiments, receiver electrodes 370 are a second plurality of electrodes disposed in a different layer, such as receiver electrodes 270, that is closer to input surface 290 in a stackup 200 than the layer in which transmitter electrodes 360 are disposed.

Although, receiver electrodes 370 are only depicted with two prongs apiece, it should be appreciated that a receiver electrode could include a greater or lesser number of prongs. In some embodiments, the receiver electrodes may be a solid block that consists of only one prong, while in other embodiments, as depicted, a receiver electrode may have multiple prongs (e.g., prongs 371 and 372 of receiver electrode $370\text{-}0_{TOP}$). In an embodiment, where a receiver electrode has only a single prong (not depicted), the single pronged receiver electrode 370 would only make a single crossing of a line, such as line 302 for a top electrode or line 303 for a bottom electrode, which overlaps display region 305 and is parallel to the axis on which dimension 306 of display region 305 is measured. In an embodiment where a receiver electrode has multiple prongs, the multiple prongs would cause the multi-pronged receiver electrode to make a multiple crossing of a line which overlaps display region 305 and is parallel to the axis on which dimension 306 of display region 305 is measured. For example, prongs 371 and 372, of receiver electrode $370\text{-}0_{TOP}$ cause receiver electrode $370\text{-}0_{TOP}$ to make multiple crossings of line 302, and similarly prongs 373 and 374 of receiver electrode $370\text{-}0_{BOTTOM}$ cause $370\text{-}0_{BOTTOM}$ to make multiple crossings of line 303.

As depicted, display screen 160 of input device 100 has a display region (e.g., a viewable portion) which has a first dimension 306 along a first axis and a second dimension 307 along second axis that is orthogonal to the first axis. Within sensor electrode pattern 300 at least one sensor electrode of transmitter electrodes 360 extends fully across first dimension 306 of display region 305. Within sensor electrode pattern 300 individual sensor electrodes of receiver electrodes 370 do not extend fully across dimension 307 of display region 305. Instead, there is a gap 301, or ohmic seam, between the like numbered top and bottom pairs of receiver electrodes 370 which prevents such full extension across dimension 307. The ohmic seam formed by gap 301 separates the square ends of prongs 371 and 372 of receiver electrode $370\text{-}0_{TOP}$ from complementary prongs 373 and 374 of receiver electrode $370\text{-}0_{BOTTOM}$. It is appreciated that the width of gap 301 may be adjusted and optimized such that gap 301 is big enough to allow for independent absolute capacitive sensing with one or more electrodes from the subset of top receiver electrodes (e.g., with little cross-coupling) and small enough that like numbered pairs can be utilized together as essentially a single receiver electrode for purposes of transcapacitive sensing.

In various embodiments, touch sensing with transcapacitive sensing includes sensing input objects anywhere in sensing region 120 and may comprise: no contact with any surfaces of the input device 100 (e.g., hovering or moving above an input surface, but within sensing region 120), contact with an input surface (e.g., a touch surface) of input device 100, contact with an input surface of the input device 100 coupled with some amount of applied force or pressure, and/or a combination thereof.

Herein, In the illustrated example, touch sensing capacitive pixels that may be detected via transcapacitive sensing are centered at locations where transmitter and receiver electrodes cross. Capacitive pixel 390 illustrates one example of such a capacitive pixel which may be generated by sensor electrode pattern 300. Capacitive pixels, such as capacitive pixel 390, are areas of localized capacitive coupling between transmitter electrodes 360 and receiver electrodes 370. The capacitive coupling between transmitter electrodes 360 and receiver electrodes 370 changes with the proximity and motion of input objects in the sensing region associated with transmitter electrodes 360 and receiver electrodes 370.

In some embodiments, sensor electrode pattern 300 is "scanned" to determine these capacitive couplings. That is, the transmitter electrodes 360 are driven to transmit transmitter signals. Transmitters may be operated such that one transmitter electrode transmits at one time, or multiple transmitter electrodes transmit at the same time. Where multiple transmitter electrodes transmit simultaneously, these multiple transmitter electrodes may transmit the same transmitter signal and produce an effectively larger transmitter electrode, or these multiple transmitter electrodes may transmit different transmitter signals. For example, multiple transmitter electrodes may transmit different transmitter signals according to one or more coding schemes that enable their combined effects on the resulting signals of receiver electrodes 370 to be independently determined. The receiver electrodes 370 may be operated singly or multiply to acquire resulting signals. The resulting signals may be used to determine measurements of the capacitive couplings at the capacitive pixels. A set of measurements from the capacitive pixels form a "capacitive image" (also "capacitive frame") representative of the capacitive couplings at the pixels. Multiple capacitive images may be acquired over multiple time periods, and differences between them used to derive information about input in the sensing region. For example, successive capacitive images acquired over successive periods of time can be used to track the motion(s) of one or more input objects entering, exiting, and within the sensing region.

Sensor electrodes, and in particular receiver electrodes 370, may also be used to perform absolute capacitive sensing. In absolute capacitive sensing, a sensing signal is driven onto a sensor electrode or set of sensor electrodes and changes in capacitance caused by coupling between the charged sensor electrode an input object may be measured by processing system 110 measuring the charge on the sensor electrode. Such absolute capacitance measurements can be used by processing system to detect an input object in sensing region 120B, that is touching input surface 290, slightly above input surface 290, or hovering/moving above input surface 290 within sensing region 120B.

During some modes of transcapacitive sensing and/or some modes of absolute sensing, similarly numbered receiver electrodes pairs (e.g., $370\text{-}0_{TOP}$ and $370\text{-}0_{BOTTOM}$) can be: operated together or treated as the same electrode even if coupled to different I/O pins of processing system 110; ohmically coupled to the same I/O pin of processing system 110 (rather than separate pins as depicted) either physically or via switching logic; or results received from such similarly numbered pairs summed together such that like numbered top and bottom receiver electrodes are form a single receiver electrode. In some modes of transcapacitive and/or absolute sensing the top subset and bottom subset of receiver electrodes 370 are utilized at different times from one another. For example, in one embodiment of transcapacitive sensing, similarly numbered receiver electrodes pairs (e.g., $370\text{-}0_{TOP}$ and $370\text{-}0_{BOTTOM}$), are operated simultaneously for transcapacitive sensing as if they were one full length sensor electrode with double routing, and processing system 110 sums separate resulting signals from each into a single transcapacitive measurement representative of a single, logically created, receiver electrode.

In embodiments where like numbered top and bottom receiver electrodes are being used at different times, when one subset (e.g., top subset of receiver electrodes 370) is being utilized for sensing, receiver electrodes of the other subset (e.g., bottom subset of receiver electrodes 370) can be floated, coupled to a constant voltage potential (e.g., ground or other constant voltage potential), or coupled to a guard signal.

In this manner, during some modes of transcapacitive sensing, similarly numbered receiver electrode pairs can be operated separately, such as at separate times. For example, processing system 110 can receive resulting signals from one subset (e.g., the top subset of receiver electrodes 370), while the other subset (e.g., the bottom subset of receiver electrodes 370) is held at a constant voltage potential or allowed to electrically float. During some modes of absolute capacitive sensing, in a similar manner, similarly numbered receiver electrode pairs can be operated separately, such as at separate times. For example, the top subset of receiver electrodes 370 may be operated to perform absolute capacitive sensing at a first time and the bottom receiver electrodes 370 may be operated to perform absolute capacitive sensing at a second time that is different than the first time. In an embodiment of absolute capacitive sensing when one subset (e.g., the top subset) is being used for sensing, the other subset that is not being used for sensing (e.g., the bottom subset) may be driven with a guard signal (e.g., a signal with the opposite polarity of an absolute capacitive sensing signal that is being driven onto the subset with which sensing is being conducted), held at a constant voltage potential, or allowed to electrically float.

Figure 4:
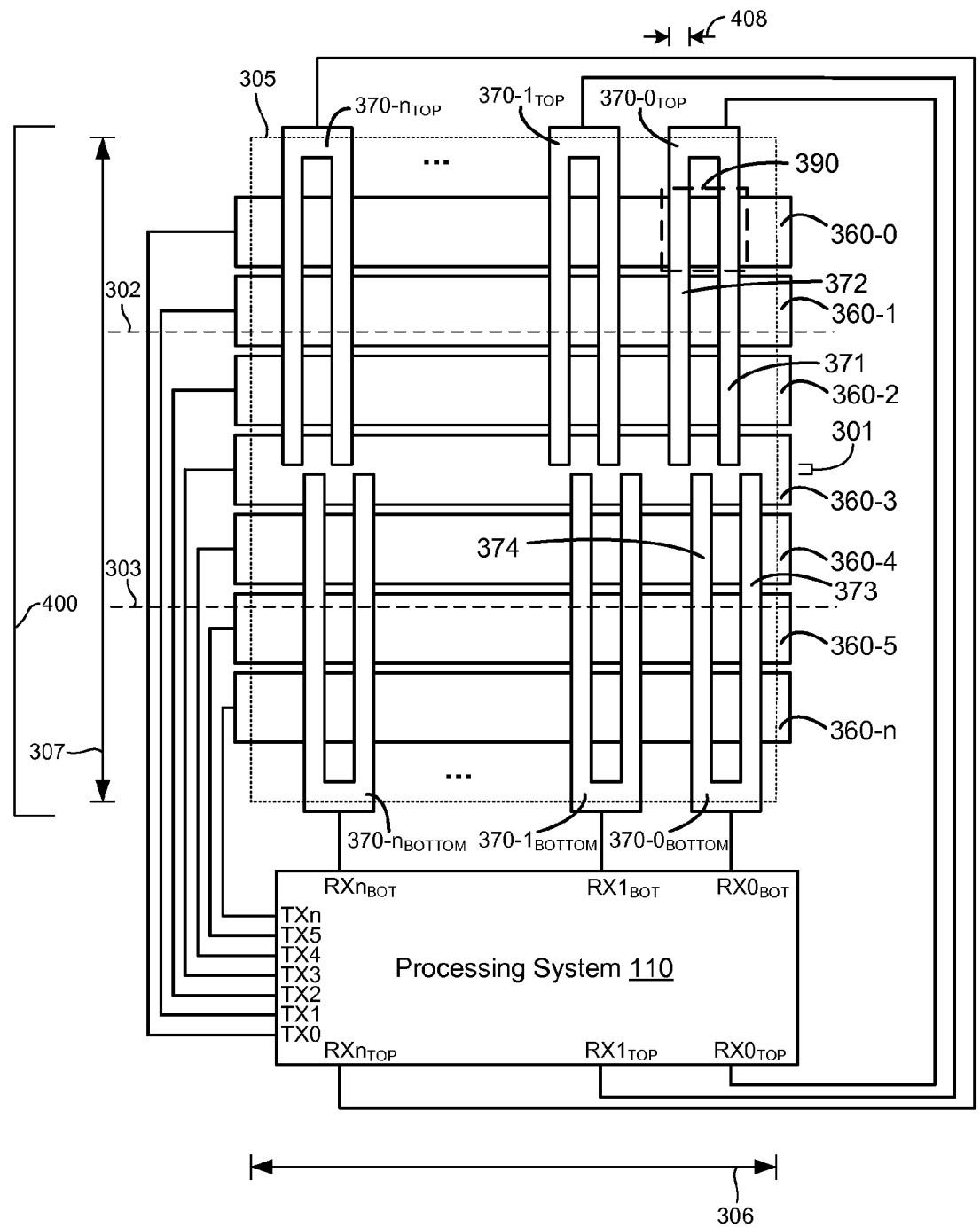
FIG. 4 shows a top plan view of a portion of an example sensor electrode pattern which may be utilized to generate all or part of the sensing region of an input device, according to some embodiments.

FIG. 4 shows a portion of an example sensor electrode pattern 400 which may be utilized to generate all or part of the sensing region 120 of an input device 100, according to some embodiments. Transmitter electrodes 360 sensor electrode pattern 400 may be used in stackup 200 in place of transmitter electrodes 260; likewise, receiver electrodes 370 of sensor electrode pattern 400 may be used in stackup 200 in place of receiver electrodes 270. Sensor electrode pattern 400 is operated in the same manner as described above with respect to sensor electrode pattern 300 and is similar in all respects except that the top subset of receiver electrodes 370 has been laterally offset with respect to the bottom set of receiver electrodes 370 by a distance 408. It should be appreciated that the offset can be greater or lesser than distance 408, in other embodiments. In some embodiments, the distance of offset is selected such that a prong of each upper receiver electrode (e.g., prong 371) is positioned laterally between the prongs (e.g., prongs 373 and 374) of a like numbered receiver electrode of the bottom subset of receiver electrodes 370.

Figure 5:
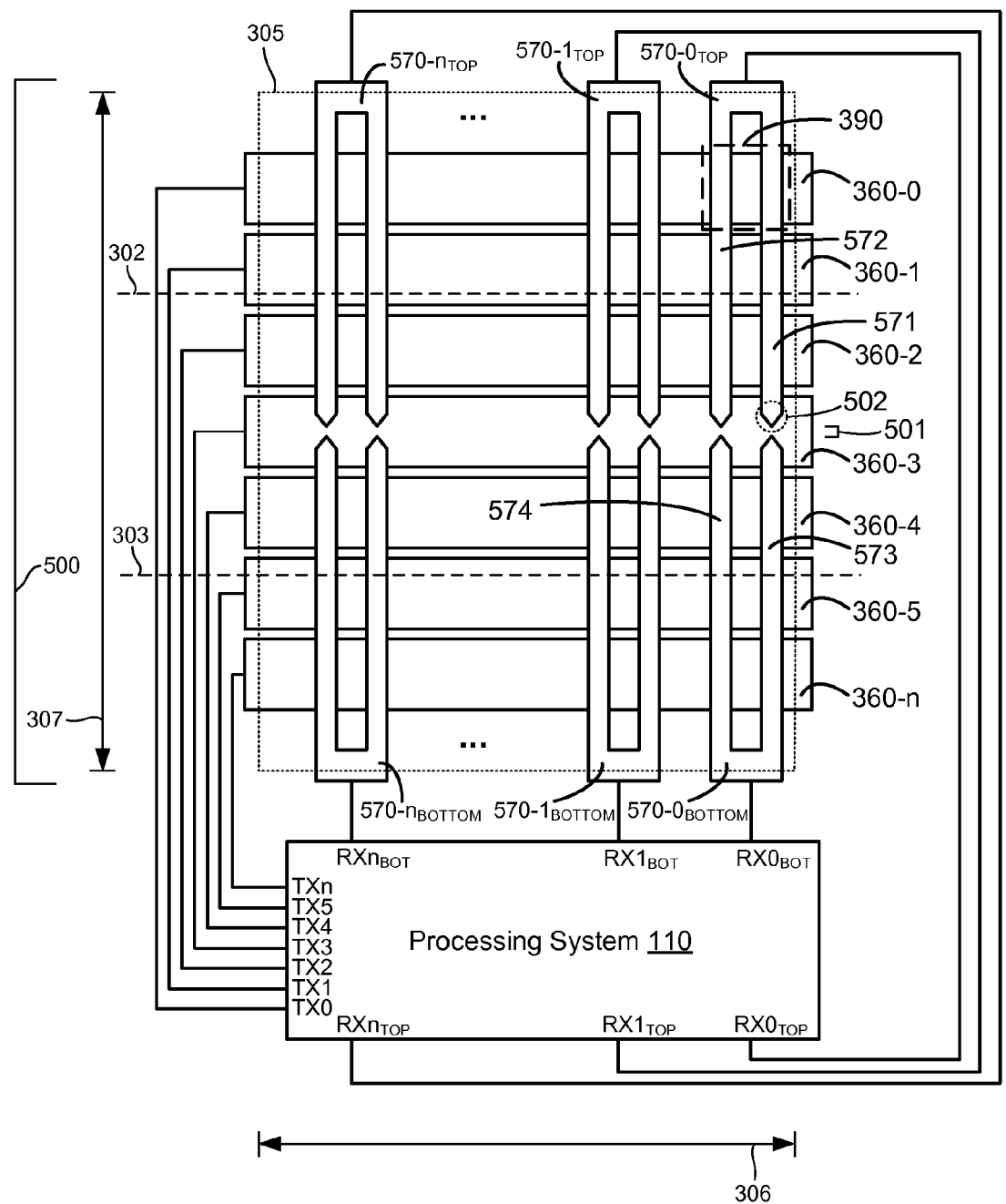
FIG. 5 shows a top plan view of a portion of an example sensor electrode pattern which may be utilized to generate all or part of the sensing region of an input device, according to some embodiments.

FIG. 5 shows a portion of an example sensor electrode pattern 500 which may be utilized to generate all or part of the sensing region 120 of an input device 100, according to some embodiments. Transmitter electrodes 360 of sensor electrode pattern 500 may be used in stackup 200 in place of transmitter electrodes 260; likewise, receiver electrodes 570 may be used in stackup 200 in place of receiver electrodes 270. Sensor electrode pattern 400 is operated in the same manner as described above with respect to sensor electrode pattern 300 and is similar in all respects except that the top subset of receiver electrodes 570 ($570\text{-}0_{TOP}$, $570\text{-}1_{TOP}$, ... $570\text{-}n_{TOP}$) has replaced top subset receiver electrodes 370 and bottom subset of receiver electrodes 570 ($570\text{-}0_{BOTTOM}$, $570\text{-}1_{BOTTOM}$, ... $570\text{-}n_{BOTTOM}$) has replaced bottom subset of receiver electrodes 370. Each prong on a top receiver electrode (e.g., prong 571 and prong 572 of top receiver electrode $570\text{-}0_{TOP}$) ends in a point 502 rather than a squared off end as with receiver electrodes 370, and is aligned with a complementary point on the end of a prong of a like numbered bottom receiver electrode. For example, prongs 571 and 572 of top receiver electrode $570\text{-}0_{TOP}$ are aligned, respectively, with prongs 573 and 574 of bottom receiver electrode $570\text{-}0_{BOTTOM}$. Use of such sharp pointed tips 502 can allow for a smaller gap 501 in the ohmic seam between top and bottom receiver electrodes than the gap 301 that is used with squared off prong ends depicted in FIG. 3. Gap 501 can be smaller due to less surface area of the top and bottom receiver electrodes at the points 502 resulting in lower cross-coupling during absolute sensing with the receiver electrodes 570 than with receiver electrodes 370 at an similarly distanced gap 301 in FIG. 3. A decreased gap 501, with comparison to gap 301 in sensor electrode pattern 300, affords improved transcapacitive response during transcapacitive sensing by virtue of resulting in better granularity of the capacitive pixels that are associated with the ohmic seam. It should be appreciated that, in various embodiments, pointed prong ends, such as point 502, may be incorporated on the ends of the any of the receiver electrode prongs depicted and/or described herein.

Figure 6:
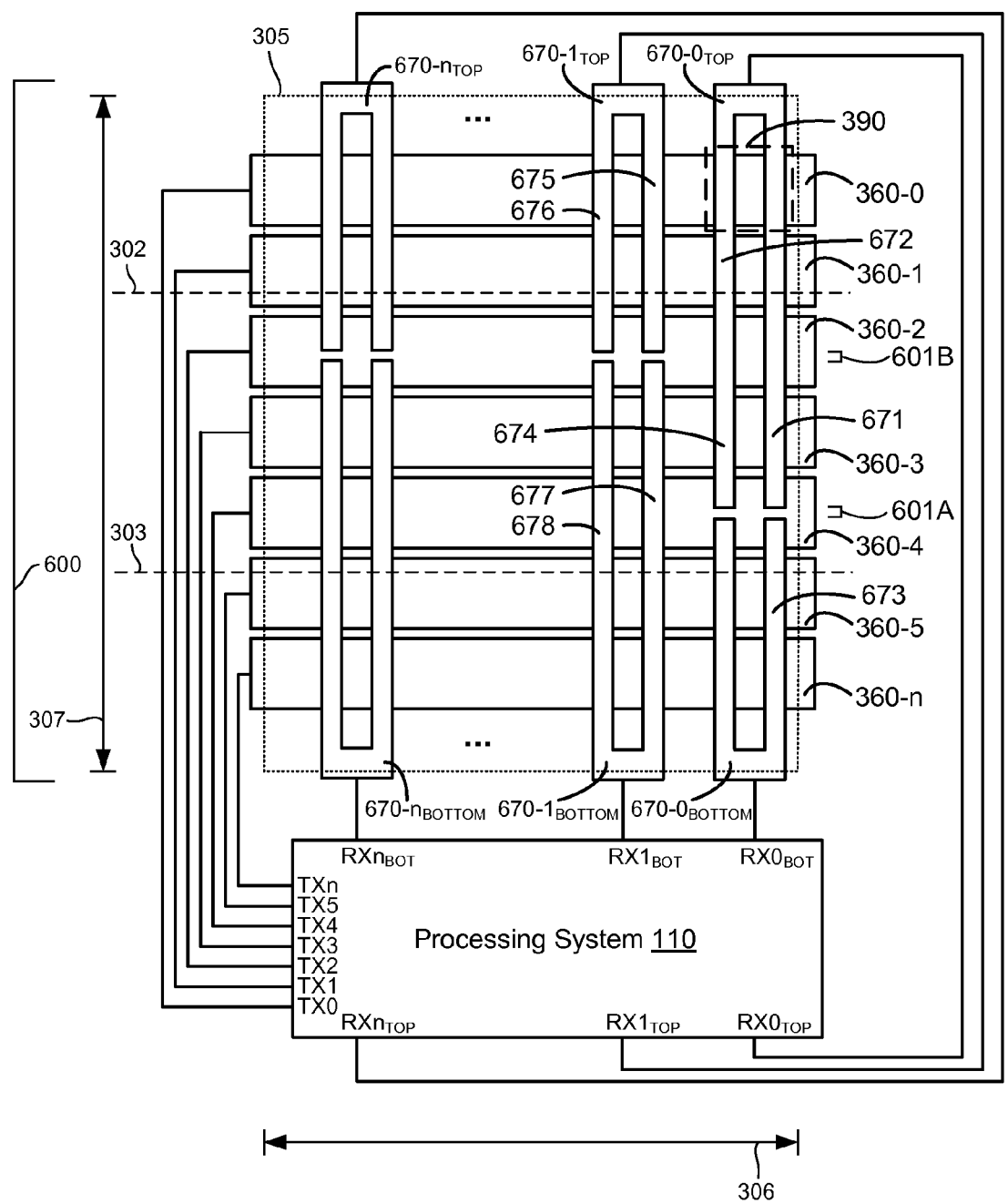
FIG. 6 show a top plan view of s a portion of an example sensor electrode pattern which may be utilized to generate all or part of the sensing region of an input device, according to some embodiments.

FIG. 6 shows a portion of an example sensor electrode pattern 600 which may be utilized to generate all or part of the sensing region 120 of an input device 100, according to some embodiments. Transmitter electrodes 360 of sensor electrode pattern 600 may be used in stackup 200 in place of transmitter electrodes 260; likewise, receiver electrodes 670 may be used in stackup 200 in place of receiver electrodes 270. Sensor electrode pattern 600 is operated in the same manner as described above with respect to sensor electrode pattern 300 and is similar in all respects except that top subset of receiver electrodes 670 ($670\text{-}0_{TOP}$, $670\text{-}1_{TOP}$, ... $670\text{-}n_{TOP}$) has replaced top subset of receiver electrodes 370 and bottom subset of receiver electrodes 670 ($670\text{-}0_{BOTTOM}$, $670\text{-}1_{BOTTOM}$, ... $670\text{-}n_{BOTTOM}$) has replaced bottom subset of receiver electrodes 370. Adjacent receiver electrodes in the top subset of receiver electrodes alternate between been having longer or shorter prongs. For example, receiver electrode $670\text{-}0_{TOP}$ has longer prongs and adjacent receiver electrode $670\text{-}1_{TOP}$ has shorter prongs. This pattern repeats among the top subset of receiver electrodes 670. A similar, but offset pattern, of short and long prongs is exhibited in receiver electrodes in the bottom subset of receiver electrodes 670, where receiver electrode $670\text{-}0_{BOTTOM}$ has short prongs and adjacent receiver electrode $670\text{-}1_{BOTTOM}$ has longer prongs. This pattern repeats among the bottom subset of receiver electrodes 670. It should be noted that in like numbered top and bottom receiver electrodes pairs, one receiver electrode has longer prongs and the other has shorter prongs. For example, longer prongs 671 and 672 of receiver electrode $670\text{-}0_{TOP}$ are positioned respectively opposite of shorter prongs 673 and 674 of receiver electrode $670\text{-}0_{BOTTOM}$ and separated by gap 601A that creates an ohmic seam. Likewise, shorter prongs 675 and 676 of receiver electrode $670\text{-}1_{TOP}$ are positioned respectively opposite of longer prongs 677 and 678 of receiver electrode $670\text{-}1_{BOTTOM}$ and separated by gap 601B that creates an ohmic seam. As can be seen, the length of the longer prongs along an axis parallel with dimension 307 is substantially greater (e.g., between 25% and 50% greater) than the length of the shorter prongs along the same axis. The alternating longer and shorter prongs and staggered location of the ohmic seam between the top and bottom subsets of receiver electrodes allows better spatial interpolation on an axis parallel with dimension 307, with respect to the position and velocity of an input object in sensing region 120B, when performing absolute sensing with receiver electrodes. It is appreciated that the length of prongs of receiver electrodes can be varied in other ways, and one such additional example is provided in FIG. 7.

Figure 7:
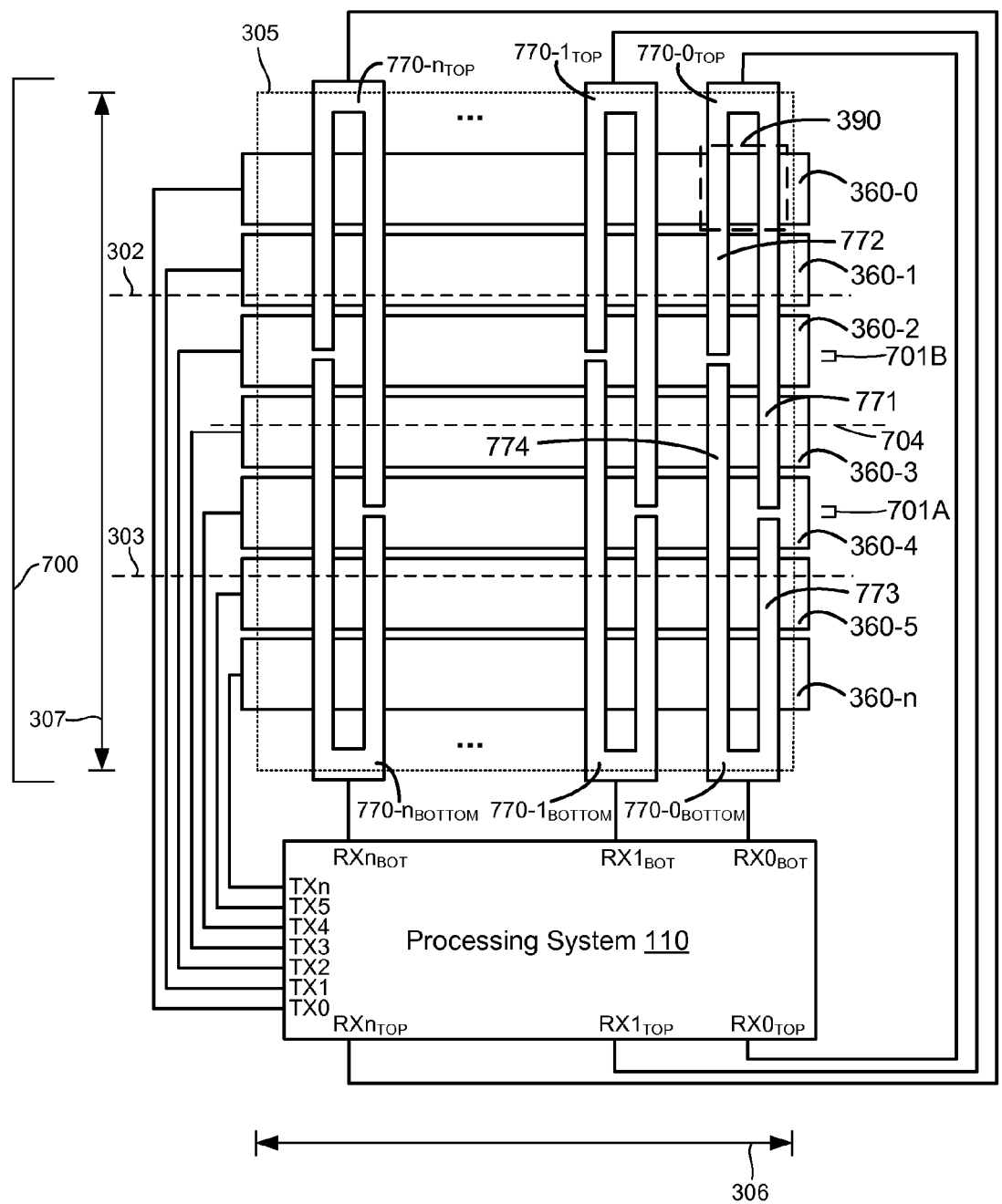
FIG. 7 shows a top plan view of a portion of an example sensor electrode pattern which may be utilized to generate all or part of the sensing region of an input device, according to some embodiments.

FIG. 7 shows a portion of an example sensor electrode pattern 700 which may be utilized to generate all or part of the sensing region 120 of an input device 100, according to some embodiments. Transmitter electrodes 360 of sensor electrode pattern 700 may be used in stackup 200 in place of transmitter electrodes 260; likewise, receiver electrodes 770 may be used in stackup 200 in place of receiver electrodes 270. Sensor electrode pattern 700 is operated in the same manner as described above with respect to sensor electrode pattern 300 and is similar in all respects except that top subset of receiver electrodes 770 (770-$0_{TOP}$, 770-$1_{TOP}$, ... 770-$n_{TOP}$) has replaced top subset of receiver electrodes 370 and bottom subset of receiver electrodes 770 (770-$0_{BOTTOM}$, 770-$1_{BOTTOM}$, ... 770-$n_{BOTTOM}$) has replaced bottom subset of receiver electrodes 370. Adjacent receiver electrode prongs in the top subset of receiver electrodes alternate between been having longer or shorter prongs. For example, receiver electrode 770-$0_{TOP}$ has one longer prong 771 and one shorter prong 772. This pattern repeats among the top subset of receiver electrodes 770. A similar, but offset pattern, of short and long prongs is exhibited in receiver electrodes in the bottom subset of receiver electrodes 770, where receiver electrode 770-$0_{BOTTOM}$ has one short prong 773 and one longer prong 774. This pattern repeats among the bottom subset of receiver electrodes 770. It should be noted that in like numbered top and bottom receiver electrodes pairs, shorter and longer prongs are located opposite one another. For example, longer prong 771 of receiver electrode 770-$0_{TOP}$ is positioned opposite of shorter prong 773 of receiver electrode 770-$0_{BOTTOM}$ and separated by a gap 701A that creates an ohmic seam. Likewise, shorter prong 772 of receiver electrode 770-$0_{TOP}$ is positioned opposite of longer prong 774 receiver electrode 770-$1_{BOTTOM}$ and separated by a gap 701B that creates an ohmic seam. As can be seen the length of the longer prongs along an axis parallel with dimension 307 is substantially greater (e.g., between 25% and 50% greater) than the length of the shorter prongs along the same axis. Because of the alternating longer/shorter length of the prongs of any particular receiver electrode, a first line drawn perpendicular to the long edge of the receiver electrodes and overlapping display region 305 may form multiple crossings with a receiver electrode 770, while a second line drawn perpendicular to the long edge of the receiver electrodes and overlapping display region 305 forms less crossings. For example, line 302 forms at least two crossings with any receiver electrode in the top subset of receiver electrodes 770, while line 704 forms only one crossing with any receiver electrode of the top subset of receiver electrodes. Likewise, line 303 forms at least two crossings with any receiver electrode in the bottom subset of receiver electrodes 770, while line 704 forms only one crossing with any receiver electrode of the bottom subset of receiver electrodes. The alternating longer and shorter prongs and staggered location of the ohmic seam between and within the receiver electrodes of the top and bottom subsets of receiver electrodes allows better spatial interpolation on an axis parallel with dimension 307, with respect to the position and velocity of an input object in sensing region 120B, when performing absolute sensing with receiver electrodes.

Figure 8:
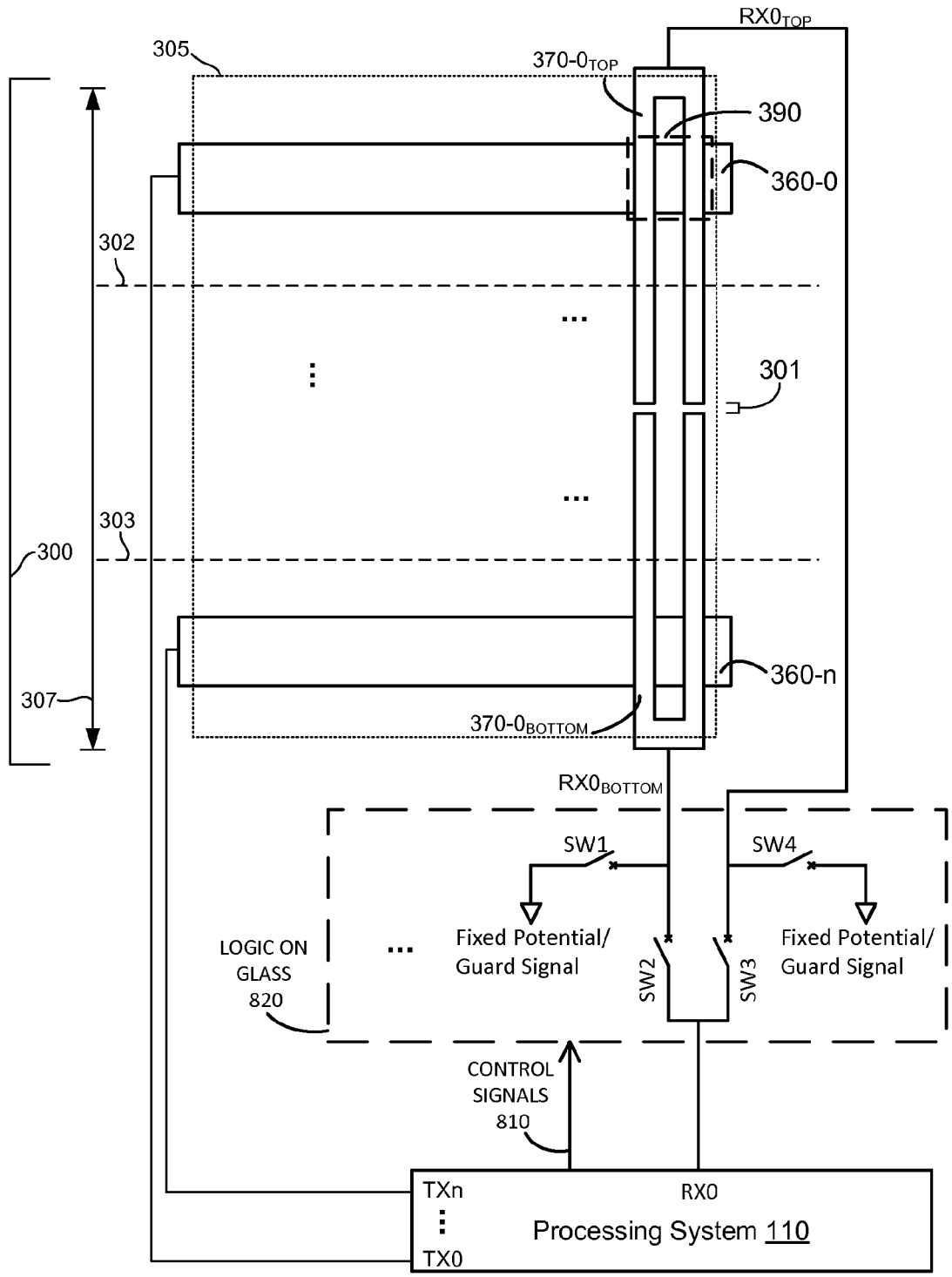
FIG. 8 shows a top plan view of a portion of an example sensor electrode pattern which may be utilized to generate all or part of the sensing region of an input device along with example switching logic which may be included between the sensor electrode pattern and a processing system, according to some embodiments.

FIG. 8 shows a portion of an example sensor electrode pattern 300 which may be utilized to generate all or part of the sensing region 120 of an input device 100 along with example switching logic 820 which may be included between the sensor electrode pattern and a processing system 110, according to some embodiments. Switching logic 820 may be disposed in a variety of locations in input device 100, one of which is on color filter glass 265 and another of which is as part of thin-film transistor layer 255. It should be appreciated that switching logic 820 can be replicated for all like numbered pairs of receiver electrodes in sensor electrode pattern 300, or other sensor electrode patterns depicted and/or described herein, and that control signals 810 may be shared across such replicated switching logic. It should also be appreciated that similar logic to switching logic 820 may also be included within processing system 110 when processing system 110 has a first input/output coupled to a top receiver electrode (e.g., 370-$0_{TOP}$) and a second, different input/output coupled to a like numbered bottom receiver electrode (e.g., 370-$0_{BOTTOM}$), as has been depicted in FIG. 3 and similarly in FIGS. 4-7.

In one embodiment, switching logic 820 includes a pair of switches coupled in parallel to a single receiver input/output of processing system 110. For example, first sides of switches SW2 and SW3 are electrically coupled in parallel with input/output RX0 of processing system 110. A second side of switch SW2 is coupled with a first side of switch SW1, while the other side of switch SW1 is selectively coupled with either a fixed voltage potential or a guard signal. A second side of switch SW3 is coupled with a first side of switch SW4, while the other side of switch SW4 is selectively coupled with either a fixed voltage potential or a guard signal. Control signals 810 from processing system 110 selectively open and close switches SW1, SW2, SW3, and SW4. In some embodiments, control signals 810 additional select whether a fixed potential or a guard signal is supplied to switches SW1 and SW4.

In operation, control signals 810 can close switches SW2 and SW3 while opening switches SW1 and SW4 to ohmically couple receiver electrode 370-$0_{TOP}$ and receiver electrode 370-$0_{BOTTOM}$ into a single electrode double routed receiver electrode 370 which has an ohmic seam at gap 301. This configuration can be used for some embodiments of both transcapacitive and absolute capacitive sensing. In one embodiment, control signals 810 can close switches SW3 and SW1 while opening switches SW2 and SW4. This configuration can be used to sense using receiver electrode 370-$0_{TOP}$ while receiver electrode 370-$0_{BOTTOM}$ is driven with a fixed voltage potential or a guard signal. In one embodiment, control signals 810 can open switches SW3 and SW1 while closing switches SW2 and SW4. This configuration can be used to sense using receiver electrode 370-$0_{BOTTOM}$ while receiver electrode 370-$0_{TOP}$ is driven with a fixed voltage potential or a guard signal. In one embodiment, control signals 810 can close switch SW3 while opening switches SW1, SW2, and SW4. This configuration can be used to sense using receiver electrode 370-$0_{TOP}$ while receiver electrode 370-$0_{BOTTOM}$ is allowed to electrically float. In one embodiment, control signals 810 can close switch SW2 while opening switches SW1, SW3, and SW4. This configuration can be used to sense using receiver electrode $370\text{-}0_{BOTTOM}$ while receiver electrode $370\text{-}0_{TOP}$ is allowed to electrically float.

Example Processing System

Figure 9:
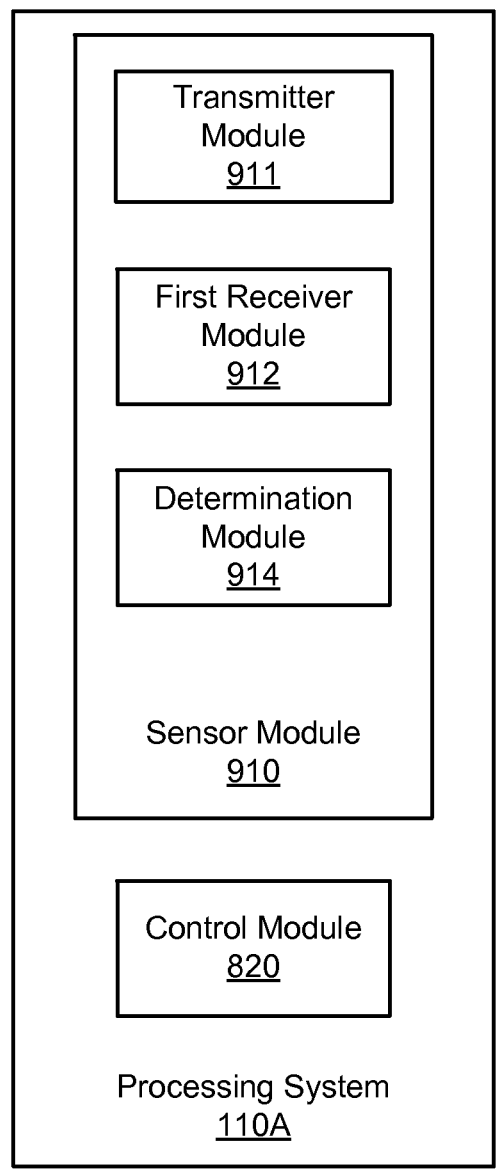
FIG. 9 shows an example processing system, according to some embodiments.

FIG. 9 illustrates a block diagram of some components of an example processing system 110A that may be utilized with an input device (e.g., in place of processing system 110 as part of input device 100, according to various embodiments). Processing system 110A may be implemented with one or more Application Specific Integrated Circuits (ASICSs), one or more Integrated Circuits (ICs), one or more controllers, or some combination thereof. In one embodiment, processing system 110A is communicatively coupled with one or more transmitter electrode(s) and receiver electrode(s) that implement a sensing region 120 of an input device 100. In some embodiments, processing system 110A and the input device, of which it is a part, may be disposed in or communicatively coupled with an electronic system 150.

In one embodiment of an input device 100, processing system 110A includes, among other components: a sensor module 910, and a control module 920. Processing system 110A and/or components thereof may be coupled with sensor electrodes of a sensor electrode pattern (e.g., 300, 400, 500, 600, 700, or the like). For example, sensor module 910 is coupled with one or more sensor electrodes of a sensor electrode pattern of input device 100. Processing system 110A couples to a sensor electrode pattern via a plurality of input/outputs. With reference to FIGS. 3-8, a first plurality of input/outputs (e.g., TX0 . . . TXn) are operable to couple with a first plurality of capacitive sensor electrodes (e.g., transmitter electrodes 360) that are oriented along a first axis. This first plurality of sensor electrodes is used for transmitting sensing signals during transcapacitive sensing and, in some embodiments, is also used to update a display screen 160 of display input device 100. Processing system 110A also includes a second plurality of input/outputs that are operable to couple with a second plurality of capacitive sensor electrodes (e.g., receiver electrodes such as receiver electrodes 370, 570, 670, 770, and the like) that are oriented along second axis that differs from the first axis.

Sensor module 910 operates to interact with receiver and transmitter sensor electrodes of a sensor pattern that is utilized to generate a sensing region 120. This includes operating transmitter electrodes to be silent or transmit a transmitter signal, operating transmitter and receiver electrodes to perform transcapacitive sensing, and operating transmitter and/or receiver electrodes to perform absolute capacitive sensing. This also includes performing absolute capacitive sensing with some a first subset of sensor electrodes while causing one or more other subsets of sensor electrodes to float, be electrically coupled to a fixed potential (e.g., ground or Vdd), or be electrically coupled to a guard signal. Sensor module 910 may also determine from received signal(s) during transcapacitive and/or absolute sensing that an input has occurred in sensing region 120, as well as determining a location of the input with respect to sensing region 120. As depicted in FIG. 9, sensor module 910 may include one or more of transmitter module 911, first receiver module 912, and determination module 914.

Transmitter module 911 includes circuitry such as selectable switches and amplifiers and operates to drive transmitter signals.

When accomplishing absolute capacitive sensing, the transmitter signal(s) may be driven on one or more transmitter electrodes and/or one or more receiver electrodes (it should be appreciated though that embodiments herein typically utilize receiver electrodes for conducting absolute capacitive sensing).

When accomplishing transcapacitive sensing, the transmitter signals are driven on one or more transmitter electrodes 360. In a given time interval, transmitter module 911 may transmit or not transmit a transmitter signal (waveform) on one or more of a plurality of transmitter electrodes 360. Transmitter module 911 may also be utilized to allow one or more transmitter electrodes 360 to electrically float and/or to electrically couple one or more transmitter electrodes 360 of a plurality of transmitter electrodes 360 to high impedance or to a constant voltage potential (e.g., ground or Vdd), when not driving a waveform on such transmitter electrodes. The transmitter signal(s) may be a square wave, trapezoidal wave, or some other waveform. Transmitter module 911 may code a transmitter signal with a coding scheme, such as a code division multiplexing scheme or other coding scheme. The code may be altered, such as lengthening or shortening the code, under direction of control module 920. For example, lengthening the code is one technique for avoiding interference.

Receiver module 912 operates to receive signals, via receiver electrodes (e.g., receiver electrodes 370, 570, 670, 770) and the like. When transcapacitive sensing is being performed, the received signals are referred to as "resulting signals" and correspond to and include some version of the transmitter signal(s) transmitted via the transmitter electrodes. These transmitted transmitter signals, may be altered or changed in the resulting signal due to the presence of an input object in a portion of sensing region 120, and/or the presence of stray capacitance, noise, interference, and/or circuit imperfections among other factors. Thus, resulting signals may differ slightly or greatly from their transmitted versions. In some embodiments, first receiver module 912 includes a plurality of amplifiers, typically one per receiver electrode. When absolute sensing is being performed, the received signals represent any detected capacitive coupling between the sensor electrodes being used to perform absolute sensing and any input object in sensing region 120. In embodiments described herein, receiver electrodes in the described sensor electrode patterns are typically utilized to perform absolute capacitive sensing by being modulated with respect to a reference voltage (e.g., system ground), and by being used to detect the capacitive coupling between the receiver electrodes and any input object(s) in sensing region 120. Receiver module 912 may also be utilized to allow one or more sensor electrodes to electrically float and/or to electrically couple one or more sensor electrodes to a constant voltage potential (e.g., ground or Vdd) or to a guard signal, when such sensor electrodes are not being used for sensing.

Determination module 914 operates to compute/determine a measurement of a change in a capacitive coupling between a transmitter electrode and a receiver electrode during transcapacitive sensing and/or to detect/measure changes in capacitive coupling between a receiver electrode and an input object during absolute capacitive sensing.

Determination module 914 uses such measurements received during transcapacitive sensing to determine a capacitive image which will depict the position of an input object (if any) with respect to sensing region 120. In some embodiments, transcapacitive sensing is utilized to detect input objects in and/or is most effective in detecting input objects in a near-field portion (120A) of sensing region 120 that is in contact with or nearly in contact with input device 100. When performing transcapacitive sensing, determination module 914 of processing system 110A receives a first type of resulting signals from the receiver electrodes (e.g., 370, 570, 670, 770, and the like). This first type of resulting signal is based on a transcapacitive coupling between receiver electrodes 370 and the second receiver electrodes, and is used by determination module 914 to determine positional information with respect to an input object 140 within sensing region 120A.

Determination module 914 uses measurements received during absolute capacitive sensing to detect a position of an input object with respect to sensing region 120. In some embodiments, absolute capacitive sensing is utilized to detect input objects in and/or is most effective in detecting input objects in a far-field portion (120B) of sensing region 120. While contacting objects can be sensed with absolute capacitive sensing, hovering objects can also be detected, typically at a greater range from an input surface than when transcapacitive sensing is employed. When performing absolute capacitive sensing, determination module 914 of processing system 110A receives a second type of resulting signals from the receiver electrodes (e.g., 370, 570, 670, 770, and the like). This second type of resulting signal based on an absolute capacitive coupling, which can include an absolute capacitive coupling between one or more receiver electrodes and an input object in sensing region 120B, and is used by determination module 914 to determine positional information with respect to an input object 140 within sensing region 120A. By conducting absolute capacitive sensing independently with a top subset of receiver electrodes and a bottom subset of receiver electrodes, determination module 914 is able to determine positional information of an input object along a first axis (e.g., an axis parallel to dimension 306) of sensing region 120B and along a second axis (e.g., an axis parallel to dimension 307), of sensing region 120B. Determination module 914 may utilize absolute capacitive sensing signals received from either or both (but typically both) of a top subset of receiver electrodes and a bottom subset of receiver electrodes when determining positional information along this first axis of sensing region 120B. Determination module 914 may utilize absolute capacitive sensing signals received from either or both of a top subset of receiver electrodes and a bottom subset of receiver electrodes when determining positional information along this second axis of sensing region 120B.

Control module 920 may be implemented as hardware (e.g., hardware logic and/or other circuitry) and/or as a combination of hardware with firmware and/or instructions stored in a non-transitory manner in a computer readable storage medium such as random access memory or read only memory. Control module 920 comprises decision making logic which directs processing system 110A and sensor module 910 to operate in a selected one of a plurality of different operating modes. Some non-limiting examples of operating modes include: transcapacitive sensing using transmitter electrodes and one or more receiver electrodes from top and bottom subsets of receiver electrodes; absolute capacitive sensing using one or more receiver electrodes of a top subset of receiver or one or more receiver electrodes of a bottom subset of receiver electrodes; and absolute capacitive sensing simultaneously using sensor electrodes from top and bottom subsets of receiver electrodes. Control module 920 may also, in some embodiments, operate transmitter electrodes as a segmented VCOM to perform display updating of display screen 160. Control module 920 may also ohmically or logically couple a pair of like numbered top and bottom receiver electrodes (e.g., receiver electrode 370-0$_{TOP}$ and receiver electrode 370-0$_{BOTTOM}$) into a single receiver electrode by causing the same signal to be driven on both and by physically or logically combining together signals receive from both. Control module 920 may select an operating mode based on various factors. Some non-limiting examples of such factors include one or more measurement(s) of interference, indication of an input being sensed or not sensed in sensing region 120 or portion (120A, 120B) thereof of input device 100, and operating mode of input device 100 (e.g., full power mode, reduced power mode). In some embodiments, control module 920 may direct processing system 110A to operate a sensor electrode pattern in strictly a transcapacitive sensing mode or in strictly an absolute capacitive sensing mode. In other embodiments, control module 920 may direct processing system 110A to operate a sensor electrode pattern in a time-sharing manner such that both transcapacitive and absolute capacitive sensing are accomplished in a hybrid manner.

Tables 1 and 2 describe some examples of a hybrid-sensing approach which may be implemented with sensor electrode patterns 300, 400, 500, 600, 700 or the like. Due to receiver electrodes being divided into top and bottom subsets, receiver electrodes are effectively double routed and thus sense and response time on a top or bottom receiver electrode is substantially shorter than for a full length, undivided receiver electrode driven on a single end. Because of this, sensing on an ohmically or logically combined receiver electrode formed of like numbered pair of top and bottom electrodes can be accomplished at substantially the same rate as could be accomplished on a double-routed (connected at opposing ends each coupled to an input/output of processing system 110A) undivided receiver electrode of the combined length of the like numbered pair of top and bottom receiver electrodes.

TABLE 1

| Phase in cycle of hybrid-sensing | Transmitter Electrodes | Top Subset of Receiver Electrodes | Bottom Subset of Receiver Electrodes | Measurements that can be Received |
|---|---|---|---|---|
| 1 | Drive Transmitters with sensing signal for transcapacitance sensing | Sense transcapacitive response from all segments of all receivers; may combine response from like numbered pairs of top and bottom receiver electrodes to form one row of transcapacitive data image | | Data for transcapacitive image for multi-finger tracking and/or interference measurement data |
| 2 | Ground transmitters electrodes, or drive them with a guard signal | Drive and sense for absolute capacitance measurement | Drive and sense for absolute capacitance measurement | Data for proximity in the form of profiles from both top subset and bottom subsets of receiver electrodes. Data may be combined into one profile. |

TABLE 1-continued

| Phase in cycle of hybrid-sensing | Transmitter Electrodes | Top Subset of Receiver Electrodes | Bottom Subset of Receiver Electrodes | Measurements that can be Received |
|---|---|---|---|---|
| 3 | Ground Transmitters | Sense transcapacitive response from all segments of all receiver electrodes; may combine response from like numbered pairs of top and bottom receiver electrodes to form one row of transcapacitive data image | | Data for finger-coupled interference sensing |

TABLE 2

| Phase in cycle of hybrid-sensing | Transmitter Electrodes | Top Subset of Receiver Electrodes | Bottom Subset of Receiver Electrodes | Measurements that can be Received |
|---|---|---|---|---|
| 1 | Drive Transmitters with sensing signal for transcapacitance sensing | Sense transcapacitive response from all segments of all receivers; may combine response from like numbered pairs of top and bottom receiver electrodes to form one row of transcapacitive data image | | Data for trans-capacitive image for multi-finger tracking and/or interference measurement data |
| 2 | Ground transmitters electrodes, or drive them with a guard signal | Drive and sense for absolute capacitance measurement | Couple constant potential voltage with bottom subset of receiver electrodes, or drive them with a guard signal | Data for proximity in a top-profile |
| 3 | Ground transmitters electrodes, or drive them with a guard signal | Couple constant potential voltage with top subset of receiver electrodes, or drive them with a guard signal | Drive and sense for absolute capacitance measurement | Data for proximity in a bottom-profile |
| 4 | Ground transmitter electrodes | Sense transcapacitive response from all segments of all receivers; may combine response from like numbered pairs of top and bottom receiver electrodes to form one row of transcapacitive data image | | Data for finger-coupled interference sensing |

With respect to Tables 1 and 2, each of the different phases is separated in time from the other phases. With respect to Table 1, in some embodiments, phase 1 may be repeated one or more times before proceeding to phase 3. With respect to Table 2, in some embodiments, phases 2 and 3 may be repeated one or more times before proceeding to phase 4.

Sensing of an absolute capacitance in the hybrid manner described in Tables 1 and 2 is an efficient source of proximity data measurements which allows implementation of various proximity gestures and use-cases based on them. In one use-case, if an input object is detected during absolute sensing, processing system 110A can switch to transcapacitive sensing. In another use-case, absolute capacitive sensing may be utilized to detect for input objects making wake-up gestures while an electronic system 150 or an input device 100 is in a reduced power mode. When such a wake-up gesture is sensed, processing system 110A may direct a transition to a higher power mode (e.g., full power mode) of operation and begin conducting transcapacitive sensing.

Moreover, it should be noted that by using receiver electrodes which are divided by an ohmic seam into top and bottom subsets, proximity gestures can be detected in two dimensions rather than in just a single dimension if the receiver electrodes were undivided. This permits detection of air swipes along the long axis of the receiver electrodes and along the short axis of the receiver electrodes by collecting two independent profiles where a top profile is associated with a top subset of receiver electrodes and a bottom profile is associated with a bottom subset of receiver electrodes. In this manner, a contacting movement or an air-swipe in top-bottom direction (parallel with direction 307) will produce changes in top/bottom profiles allowing: distinguishing it against a slapping motion; determination of direction of motion; and determination of speed of a motion.

Example Methods of Operation

Figure 10B:
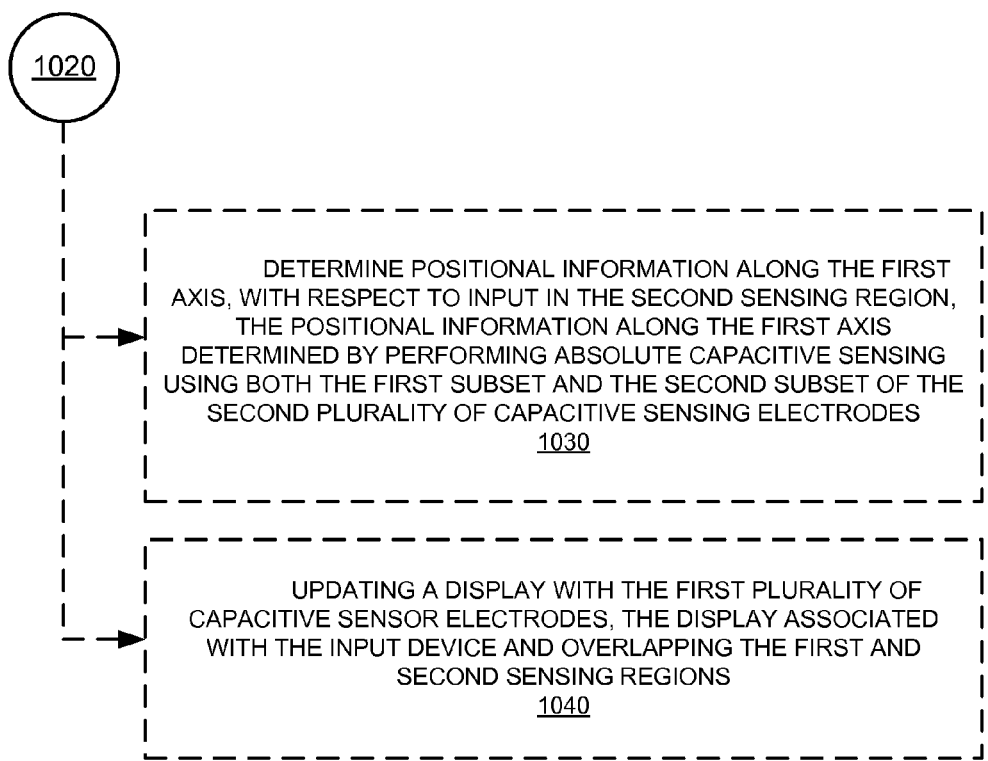

FIGS. 10A and 10B illustrate a method of operating an input device, according to various embodiments. Procedures of this method will be described with reference to elements and/or components of one or more of FIGS. 1-9. It is appreciated that in some embodiments, the procedures may be performed in a different order than described, that some of the described procedures may not be performed, and/or that one or more additional procedures to those described may be performed.

At procedure 1010 of flow diagram 1000, in one embodiment, first positional information is determined. The first positional information is related to input in a first sensing region (e.g., sensing region 120A) of an input device 100 by performing transcapacitive sensing using a first plurality of capacitive sensor electrodes and a second plurality of capacitive sensor electrodes. With reference to FIGS. 3-8, in one embodiment, the first plurality of capacitive sensor electrodes comprises transmitter electrodes 360 that are oriented along a first axis that is parallel with dimension 306 and the second plurality of capacitive sensor electrodes comprises receiver electrodes (e.g., receiver electrodes 370, 570, 670, 770, or the like) that are oriented along a second axis that is different from the first axis. For example, in some embodiments, the second axis is parallel with dimension 307 and substantially orthogonal to the first axis. In one embodiment, the first plurality of sensor electrodes is disposed in or as a part of a first layer of a stackup (e.g., stackup 200) and the second plurality of sensor electrodes are disposed in a second layer the stackup, where the second layer and first layer are different layers of the stackup.

At procedure 1020 of flow diagram 1000, in one embodiment, positional information along the second axis is determined, with respect to input in a second sensing region (e.g., sensing region 120B) of input device 100. The positional information along the second axis determined by performing absolute capacitive sensing using either a first subset (e.g., a top subset of receiver electrodes) or a second subset (e.g., a bottom subset of receiver electrodes) of the second plurality of capacitive sensing electrodes.

At procedure 1030 of flow diagram 1000, in one embodiment, the method as described in 1010 and 1020 further includes determining positional information along the first axis, with respect to input in the second sensing region (e.g., sensing region 120B). The positional information along the first axis is determined by performing absolute capacitive sensing using both the first subset and the second subset of the second plurality of capacitive sensing electrodes (e.g., by using both the top and bottom subsets of receiver electrodes).

At procedure 1040 of flow diagram 1000, in one embodiment, the method as described in 1010 and 1020 further includes updating a display screen with the first plurality of capacitive sensor electrodes. For example, in one embodiment, this comprises using transmitter electrodes 360 as a segmented VCOM electrode to update a display screen 160 which is associated with input device 100 and which is overlapped by first sensing region 120A and the second sensing region 120B.

The examples set forth herein were presented in order to best explain, to describe particular applications, and to thereby enable those skilled in the art to make and use embodiments of the described examples. However, those skilled in the art will recognize that the foregoing description and examples have been presented for the purposes of illustration and example only. The description as set forth is not intended to be exhaustive or to limit the embodiments to the precise form disclosed.

What is claimed is:

1. An input device comprising:
   a first plurality of capacitive sensor electrodes oriented along a first axis, disposed in a first layer, and configured to update a display screen of said input device;
   a second plurality of capacitive sensor electrodes oriented along a second axis that differs from said first axis; and
   wherein a display region of said display screen has a first dimension along said first axis and a second dimension said second axis, wherein at least one capacitive sensor electrode of said first plurality of capacitive sensor electrodes extends fully across said first dimension of said display region, and wherein an opposed pair of said second plurality of capacitive sensor electrodes taken together extends substantially across said second dimension of said display region but no single individual capacitive sensor electrode extends fully across said second dimension of said display region, wherein at least one capacitive sensor electrode of said second plurality of capacitive sensor electrodes comprises prongs and forms multiple crossings with a first line overlapping said display region and perpendicular to said second axis, and wherein each of said prongs is substantially rectangular except for a pointed end configured to reduce cross-coupling with others of said second plurality of capacitive sensor electrodes, and wherein said pointed ends of said opposed pair are arranged such that they are aligned with and oppose one another.

2. The input device of claim 1, further comprising:
   a processing system coupled with said first plurality of capacitive sensor electrodes and with said second plurality of capacitive sensor electrodes, said processing system configured to:
      receive a first type of resulting signals from the said second plurality of capacitive sensor electrodes, said first type of resulting signal based on a transcapacitive coupling between said first plurality of capacitive sensor electrodes and said second plurality of capacitive sensor electrodes;
      receive a second type of resulting signals from a first subset and a second subset of said second plurality of said capacitive sensor electrodes, the second type of resulting signal based on an absolute capacitive coupling; and
      determine positional information of an input object along said second axis, with respect to a sensing region of said input device, said positional information along said second axis determined based on said second type of resulting signals from either said first subset or said second subset of said capacitive sensor electrodes.

3. The input device of claim 2, wherein said processing system is further configured to:
   determine positional information of said input object along said first axis, with respect to said sensing region of said input device, said positional information along said first axis determined based on said second type of resulting signals from both said first subset and said second subset of said capacitive sensor electrodes.

4. The input device of claim 2, wherein said processing system is further configured to:
   receive said second type of resulting signals from said first subset of said second plurality of capacitive sensor electrodes while driving said second subset of said second plurality of capacitive sensor electrodes with a substantially constant voltage.

5. The input device of claim 2, wherein said processing system is further configured to:
   update said display screen of said input device using said first plurality of capacitive sensor electrodes.

6. The input device of claim 2, wherein said processing system is further configured to:
   ohmically couple a capacitive sensor electrode of said first subset of said second plurality of capacitive sensor electrodes with a capacitive sensor electrode of said second subset of said second plurality of capacitive sensor electrodes.

7. The input device of claim 2, further comprising a switch configured for ohmically coupling a capacitive sensor electrode of said first subset of said second plurality of capacitive sensor electrodes with a capacitive sensor electrode of said second subset of said second plurality of capacitive sensor electrodes, said switch coupled with and controlled by said processing system.

8. The input device of claim 7, wherein said switch is disposed in a thin-film transistor (TFT) layer of said display screen of said input device.

9. The input device of claim 1, wherein a second line overlapping said display region and perpendicular to said second axis forms greater than zero crossing, but less crossings with said at least one capacitive sensor electrode of said second plurality of capacitive sensor electrodes than said multiple crossings which are formed with said first line.

10. The input device of claim 1, wherein the length along said second axis of a first capacitive sensor electrode of said second plurality of capacitive sensor electrodes along is substantially greater than the length along said second axis of a second capacitive sensor electrode of said second plurality of capacitive sensor electrodes.

11. The input device of claim 1, wherein said first layer comprises a thin-film transistor (TFT) layer of said display screen.

12. The input device as recited in claim 1, wherein said second plurality of capacitive sensor electrodes is disposed in a second layer that differs from said first layer.

13. The input device as recited in claim 1, wherein said second plurality of capacitive sensor electrodes is disposed said first layer.

14. A processing system for an input device, said processing system comprising:
a sensor module;
a first plurality of input/outputs configured to couple said sensor module with a first plurality of capacitive sensor electrodes that are oriented along a first axis, the first plurality of capacitive sensor electrodes configured to update a display screen of said input device, and wherein the individual capacitive sensor electrodes of said first plurality of capacitive sensor electrodes extend fully across a first dimension of said display screen that is parallel with said first axis;
a second plurality of input/outputs configured to couple said sensor module with a second plurality of capacitive sensor electrodes that are oriented along second axis that differs from said first axis, wherein an opposed pair of said second plurality of capacitive sensor electrodes taken together extends substantially across said second dimension of said display region but no single capacitive sensor electrode oriented along said second axis extends fully across a second dimension of said display screen that is parallel with said second axis, wherein at least one capacitive sensor electrode of said second plurality of capacitive sensor electrodes comprises prongs and forms multiple crossings with a first line overlapping said display region and perpendicular to said second axis, and wherein each of said prongs is substantially rectangular except for a pointed end configured to reduce cross-coupling with others of said second plurality of capacitive sensor electrodes, and wherein said pointed ends of said opposed pair are arranged such that they are aligned with and oppose one another; and
wherein said processing system configured to:
receive, by said sensor module, a first type of resulting signals from the said second plurality of capacitive sensor electrodes, said first type of resulting signal based on a transcapacitive coupling between said first plurality of capacitive sensor electrodes and said second plurality of capacitive sensor electrodes;
receive, by said sensor module, a second type of resulting signals from a first subset and a second subset of said second plurality of said capacitive sensor electrodes, the second type of resulting signal based on an absolute capacitive coupling; and
determine, by said sensor module, positional information of an input object along said second axis, with respect to a sensing region of said input device, said positional information along said second axis determined based on said second type of resulting signals from either said first subset or said second subset of said second plurality of capacitive sensor electrodes.

15. The processing system of claim 14, wherein said processing system is further configured to:
determine, by said sensor module, positional information of said input object along said first axis, with respect to said sensing region of said input device, said positional information along said first axis determined based on said second type of resulting signals from both said first subset and said second subset of said capacitive sensor electrodes.

16. The processing system of claim 14, wherein said processing system is further configured to:
receive, by said sensor module, said second type of resulting signals from said first subset of said second plurality of capacitive sensor electrodes while driving said second subset of said second plurality of capacitive sensor electrodes with a substantially constant voltage.

17. The processing system of claim 14, wherein said processing system is further configured to:
update said display screen of said input device using said first plurality of capacitive sensor electrodes.

18. The processing system of claim 14, wherein said processing system is further configured to:
ohmically couple a capacitive sensor electrode of said first subset of said second plurality of capacitive sensor electrodes with a capacitive sensor electrode of said second subset of said second plurality of capacitive sensor electrodes.

19. A method of operating an input device, wherein said method comprises:
determining first positional information related to input in a first sensing region of said input device by performing transcapacitive sensing using a first plurality of capacitive sensor electrodes and a second plurality of capacitive sensor electrodes,
wherein said first plurality of capacitive sensor electrodes is oriented along a first axis and disposed in a first layer, and wherein the individual capacitive sensor electrodes of said first plurality of capacitive sensor electrodes extend fully across a first dimension of a display screen that is parallel with said first axis, and
wherein said second plurality of capacitive sensor electrodes is oriented along a second axis that differs from said first axis and disposed in a second layer that differs from said first layer, wherein an opposed pair of said second plurality of capacitive sensor electrodes taken together extends substantially across said second dimension of said display region but no single capacitive sensor electrode oriented along said second axis extends fully across a second dimension of said display screen that is parallel with said second axis, wherein at least one capacitive sensor electrode of said second plurality of capacitive sensor electrodes comprises prongs and forms multiple crossings with a first line overlapping said display region and perpendicular to said second axis, and wherein each of said prongs is substantially rectangular except for a pointed distal end configured to reduce cross-coupling with others of said second plurality of capacitive sensor electrodes, and wherein said pointed ends of said opposed pair are arranged such that they are aligned with and oppose one another; and determining positional information along said second axis, with respect to input in a second sensing region of said input device, said positional information along said second axis determined by performing absolute capacitive sensing using either a first subset or a second subset of said second plurality of capacitive sensing electrodes.

20. The method as recited in claim 19, further comprising:
determining positional information along said first axis, with respect to input in said second sensing region, said positional information along said first axis determined by performing absolute capacitive sensing using both said first subset and said second subset of said second plurality of capacitive sensing electrodes.

21. The method as recited in claim 19, further comprising:
updating a display screen with said first plurality of capacitive sensor electrodes, said display screen associated with said input device and overlapped by said first sensing region and said second sensing region.

* * * * *